(12) United States Patent
Yeon et al.

(10) Patent No.: US 9,954,028 B2
(45) Date of Patent: Apr. 24, 2018

(54) LIGHT EMITTING DEVICE PACKAGE AND DISPLAY DEVICE USING THE SAME

(71) Applicant: Samsung Electronics Co., Ltd., Suwon-si (KR)

(72) Inventors: Ji Hye Yeon, Suwon-si (KR); Sung Hyun Sim, Uiwang-si (KR); Wan Tae Lim, Suwon-si (KR); Yong Il Kim, Seoul (KR); Hanul Yoo, Bucheon-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/449,396

(22) Filed: Mar. 3, 2017

(65) Prior Publication Data

US 2018/0047780 A1 Feb. 15, 2018

(30) Foreign Application Priority Data

Aug. 11, 2016 (KR) .................. 10-2016-0102473

(51) Int. Cl.
*H01L 27/15* (2006.01)
*H01L 33/50* (2010.01)

(52) U.S. Cl.
CPC .......... *H01L 27/156* (2013.01); *H01L 33/50* (2013.01)

(58) Field of Classification Search
CPC ...... H01L 27/15; H01L 27/153; H01L 27/156
See application file for complete search history.

(56) References Cited

U.S. PATENT DOCUMENTS

| 6,372,608 | B1 | 4/2002 | Shimoda et al. |
| 6,645,830 | B2 | 11/2003 | Shimoda et al. |
| RE38,466 | E | 3/2004 | Inoue et al. |
| 6,818,465 | B2 | 11/2004 | Biwa et al. |
| 6,818,530 | B2 | 11/2004 | Shimoda et al. |

(Continued)

FOREIGN PATENT DOCUMENTS

KR 10-2017-0100999 9/2017

*Primary Examiner* — Jae Lee
(74) *Attorney, Agent, or Firm* — Muir Patent Law, PLLC

(57) ABSTRACT

A light emitting device package includes a substrate for growth having a plurality of light-emitting windows, a plurality of semiconductor light-emitting units corresponding to the plurality of light-emitting windows, each semiconductor light-emitting unit having a first surface contacting the substrate for growth and a second surface opposite the first surface, and each semiconductor light-emitting unit having a first conductivity-type semiconductor layer, an active layer, and a second conductivity-type semiconductor layer stacked on each other, a plurality of wavelength conversion units respectively disposed inside the plurality of light-emitting windows, each wavelength conversion unit is configured to provide light having a wavelength different from light emitted by the respective semiconductor light-emitting unit, a metal support layer disposed on at least one surface of each of the plurality of semiconductor light-emitting units and having a lateral surface coplanar with a lateral surface of the substrate for growth, and an insulating layer disposed between each of the plurality of semiconductor light-emitting units and a respective metal support layer.

20 Claims, 22 Drawing Sheets

(56) References Cited

U.S. PATENT DOCUMENTS

| | | |
|---|---|---|
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,179,670 B2 | 2/2007 | Shelton et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,168,470 B2 | 5/2012 | Lin et al. |
| 8,179,938 B2 | 5/2012 | Kim |
| 8,263,987 B2 | 9/2012 | Choi et al. |
| 8,324,646 B2 | 12/2012 | Lee et al. |
| 8,399,269 B2 | 3/2013 | Wang |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,563,342 B2 | 10/2013 | Yoneda et al. |
| 8,598,619 B2 | 12/2013 | Kim et al. |
| 8,735,931 B2 | 5/2014 | Han et al. |
| 8,766,295 B2 | 7/2014 | Kim |
| 8,884,505 B2 | 11/2014 | Lee |
| 8,902,378 B2 | 12/2014 | Lee et al. |
| 9,082,947 B2 | 7/2015 | Rhee et al. |
| 9,093,629 B2 | 7/2015 | Rhee et al. |
| 9,206,967 B2 | 12/2015 | Bang |
| 9,786,712 B2 * | 10/2017 | Fujimoto .......... H01L 27/14663 |
| 2012/0014091 A1 | 1/2012 | He et al. |
| 2012/0032192 A1 | 2/2012 | Shen et al. |
| 2012/0087108 A1 | 4/2012 | Ke et al. |
| 2014/0001494 A1 | 1/2014 | Shen et al. |
| 2014/0312368 A1 | 10/2014 | Lee et al. |
| 2015/0001557 A1 | 1/2015 | Yoon et al. |
| 2015/0221619 A1 | 8/2015 | Rhee |
| 2015/0228865 A1 | 8/2015 | Rhee |
| 2015/0255439 A1 | 9/2015 | Kim |
| 2015/0255505 A1 | 9/2015 | Jeoung et al. |
| 2015/0362165 A1 * | 12/2015 | Chu .................... H01L 25/0753 362/235 |
| 2017/0250316 A1 | 8/2017 | Yeon et al. |
| 2017/0250318 A1 * | 8/2017 | Cha ....................... H01L 33/502 |

* cited by examiner

I-I'

I-I'

I-I'

I-I'

I-I'

I - I'

LIGHT EMITTING DEVICE PACKAGE AND DISPLAY DEVICE USING THE SAME

CROSS-REFERENCE TO RELATED APPLICATION

This application claims benefit of priority under 35 U.S.C. § 119 to Korean Patent Application No. 10-2016-0102473 filed on Aug. 11, 2016, with the Korean Intellectual Property Office, the disclosure of which is incorporated herein by reference in its entirety.

BACKGROUND

1. Field

The present disclosure relates to a light emitting device package and a display device using the same.

2. Description of Related Art

A semiconductor light-emitting diode (LED) may not only be used as a light source of a lighting apparatus, but also as a light source of various electronic products. For example, such a semiconductor LED is widely used as a light source for various display devices such as TVs, cellular phones, PCs, laptop PCs, personal digital assistants (PDA), or the like.

Display devices according to the related art commonly include a liquid crystal display (LCD) panel and a backlight unit. However, an LED device having a form in which an individual LED device is used as a single pixel, so that a display device does not require a separate backlight unit, has recently been developed. Such a display device may be in compact form, and a high luminance display having excellent light efficiency in comparison with an LCD according to the related art may be implemented. In addition, an aspect ratio of a display screen may be freely changed and a display screen having a large area may be implemented. Therefore, a large display having various forms may be provided.

SUMMARY

An aspect of the present disclosure may provide a light emitting device package with a reduced light-leakage phenomenon and a display device using the same.

According to an aspect of the present disclosure, a light emitting device package may include: a substrate for growth having a plurality of light-emitting windows; a plurality of semiconductor light-emitting units corresponding to the plurality of light-emitting windows, each semiconductor light-emitting unit having a first surface contacting the substrate for growth and a second surface opposite the first surface, and each semiconductor light-emitting unit having a first conductivity-type semiconductor layer, an active layer, and a second conductivity-type semiconductor layer stacked on each other; a plurality of wavelength conversion units respectively disposed inside the plurality of light-emitting windows, each wavelength conversion unit is configured to provide light having a wavelength different from light emitted by the respective semiconductor light-emitting unit; a metal support layer disposed on at least one surface of each of the plurality of semiconductor light-emitting units and having a lateral surface coplanar with a lateral surface of the substrate for growth; and an insulating layer disposed between each of the plurality of semiconductor light-emitting units and a respective metal support layer.

According to an aspect of the present disclosure, a light emitting device package may include: a cell array, including a plurality of semiconductor light-emitting units, each semiconductor light-emitting unit having a first surface at a first vertical height and a second surface opposite the first surface at a second vertical height, and each semiconductor light emitting unit including a first conductivity-type semiconductor layer, an active layer, and a second conductivity-type semiconductor layer stacked on each other; a plurality of wavelength conversion units disposed respectively on the plurality of semiconductor light-emitting units, each wavelength conversion unit having a first surface at the first vertical height and a second surface at a third vertical height, wherein the first vertical height is between the second vertical height and the third vertical height, each wavelength conversion unit configured to convert a wavelength of light, emitted by a respective one of the plurality of semiconductor light emitting units, into a different wavelength of light; a metal support layer disposed on at least one surface of each of the plurality of semiconductor light-emitting units and having a lateral surface coplanar with a lateral surface of the substrate for growth; and an insulating layer disposed between each of the plurality of semiconductor light-emitting units and a respective metal support layer.

According to an aspect of the present disclosure, a display device may include: a display panel including a circuit board and a plurality of light emitting device packages disposed on the circuit board in rows and columns, each of the plurality of light emitting device packages providing a single pixel; a panel driving unit configured to drive the display panel; and a control unit configured to control the panel driving unit, wherein each of the plurality of light emitting device packages includes: a substrate for growth having a plurality of light-emitting windows; a plurality of semiconductor light-emitting units corresponding to the plurality of light-emitting windows, each semiconductor light-emitting unit including a first conductivity-type semiconductor layer, an active layer, and a second conductivity-type semiconductor layer; a plurality of wavelength conversion units correspondingly disposed inside the plurality of light-emitting windows, each wavelength conversion unit configured to convert a wavelength of light, emitted by a respective one of the plurality of semiconductor light emitting units, into a different wavelength of light; a metal support layer disposed on at least one surface of each of the plurality of semiconductor light-emitting units and having a lateral surface coplanar with a lateral surface of the substrate for growth; and an insulating layer disposed between each of the plurality of semiconductor light-emitting units and a respective metal support layer.

BRIEF DESCRIPTION OF DRAWINGS

The above and other aspects, features and other advantages of the present inventive concept will be more clearly understood from the following detailed description, taken in conjunction with the accompanying drawings, in which:

FIGS. 7A to 14A and 7B to 14B are side cross-sectional views schematically illustrating a main manufacturing process of the light emitting device package of FIG. 4, according to some embodiments.

DETAILED DESCRIPTION

Figure 1:
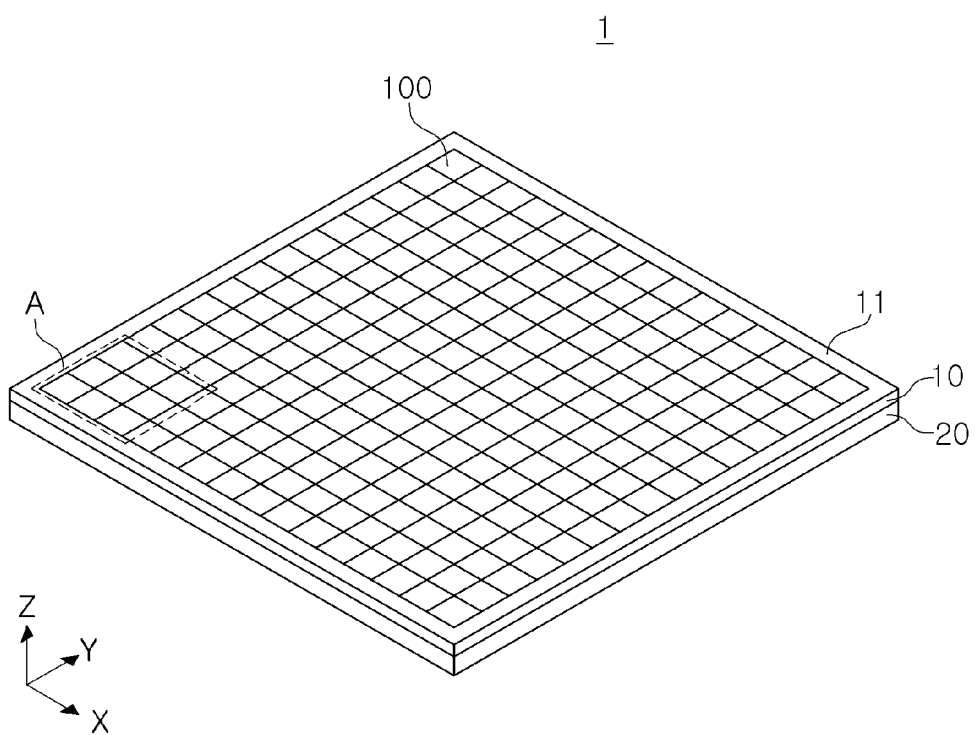
FIG. 1 is a perspective view schematically illustrating a display panel having a light emitting device package according to an example embodiment.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

FIG. 1 is a perspective view schematically illustrating a display panel having a light emitting device package according to an example embodiment.

With reference to FIG. 1, a display panel 1 may include a circuit board 20, and a light emitting device module 10 arranged on the circuit board 20.

The light emitting device module 10 according to an example embodiment may include a plurality of light emitting device packages 100 each selectively emitting light having a red (R) color, light having a green (G) color, and light having a blue (B) color. Each of the plurality of light emitting device packages 100 may configure a single pixel of a display panel, and the plurality of light emitting device packages 100 may be arranged on the circuit board 20 in rows and columns. In an example embodiment as illustrated in FIG. 1, a form in which 15×15 light emitting device packages 100 are arranged is exemplified for convenience of description, but a greater number of light emitting device packages (for example, 1024×768, 1920×1080) may be arranged according to required resolution.

A light emitting device package 100 may include a sub-pixel corresponding to RGB light sources, and sub-pixels may be provided to be spaced apart from each other, which will be described in detail with reference to FIGS. 3 to 6. A color of a sub-pixel is not limited to RGB, and CYMK (Cyan, Yellow, Magenta, and Black) light sources may be used.

According to an example embodiment, the circuit board 20 may include a driving unit configured to supply power to each light emitting device package 100 of the light emitting device module 10, and a control unit for controlling the light emitting device package 100.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

The display panel 1 may further include a first molding part 11 disposed on the circuit board 20. The first molding part 11 may be formed using a matrix such as a black matrix, and may also be referred to as a frame. For example, the black matrix may be disposed on a circumference of the circuit board to serve as a guideline for defining a region in which the light emitting device package 100 is mounted. The black matrix is not limited to being black, and matrices of other colors such as a white matrix, a green matrix, or the like may be used according to a use and a place of use, or the like, of a product. Moreover, a matrix of a transparent material may be used as needed. The white matrix may further include a light reflective material or a light scattering material. The black matrix may include at least one of a material such as a polymer including a resin, a ceramic, a semiconductor or a metal.

Figure 2:
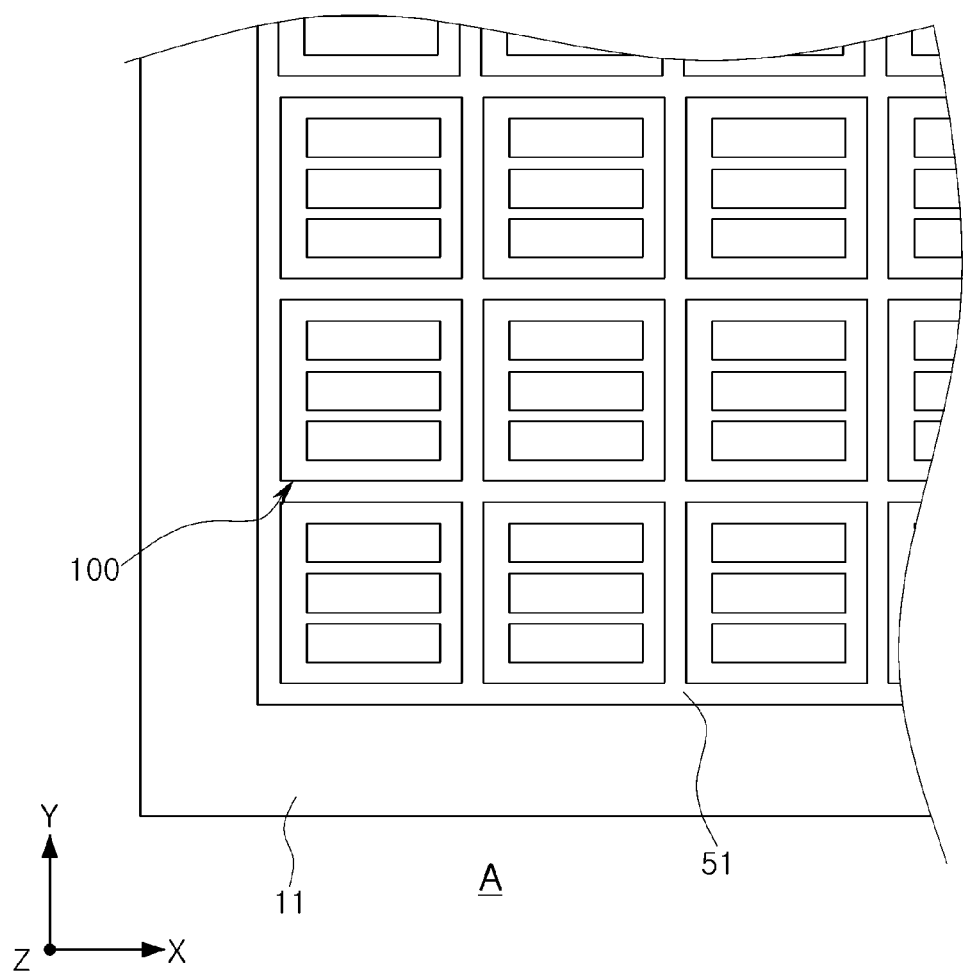
FIG. 2 is an enlarged plan view illustrating portion A in FIG. 1.
Figure 3:
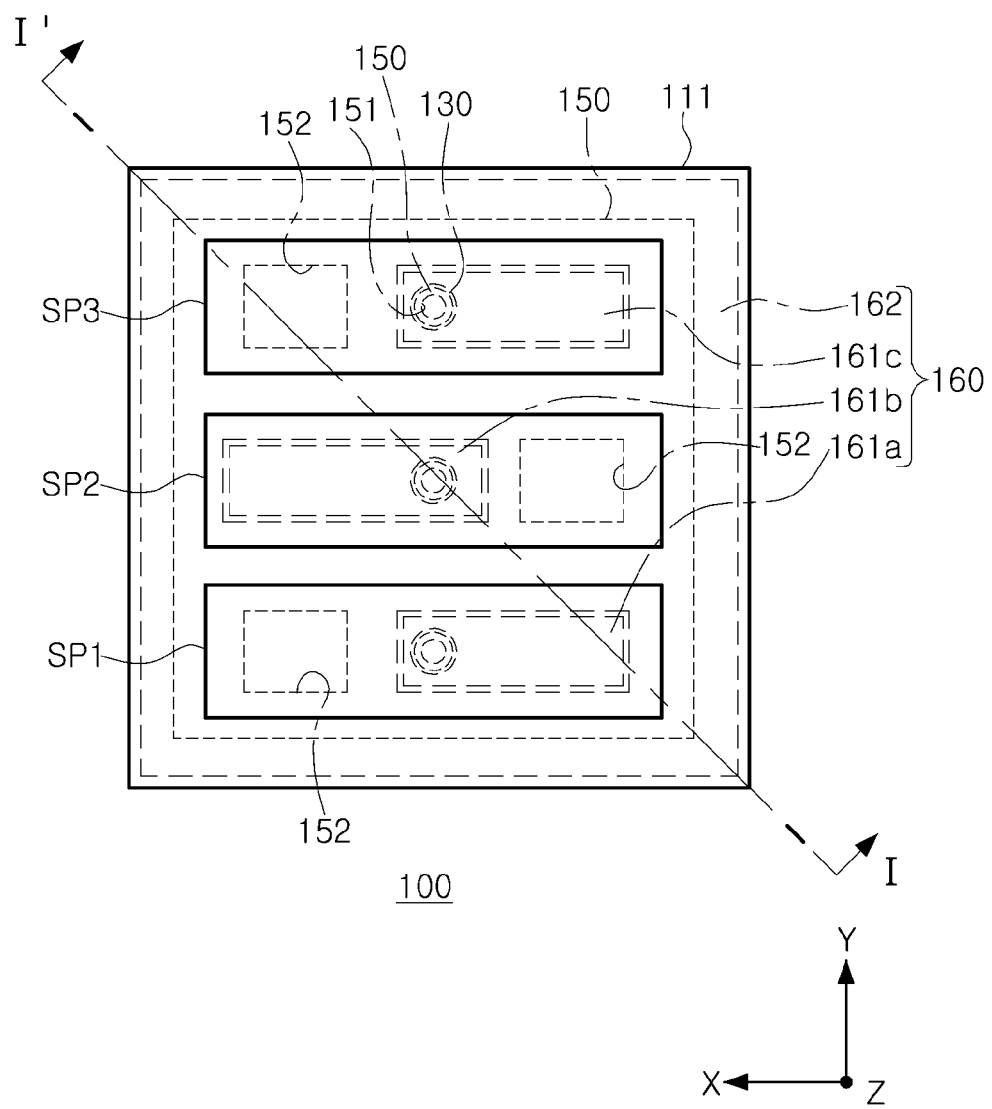
FIG. 3 is an enlarged plan view illustrating the light emitting device package of FIG. 2.
Figure 4:
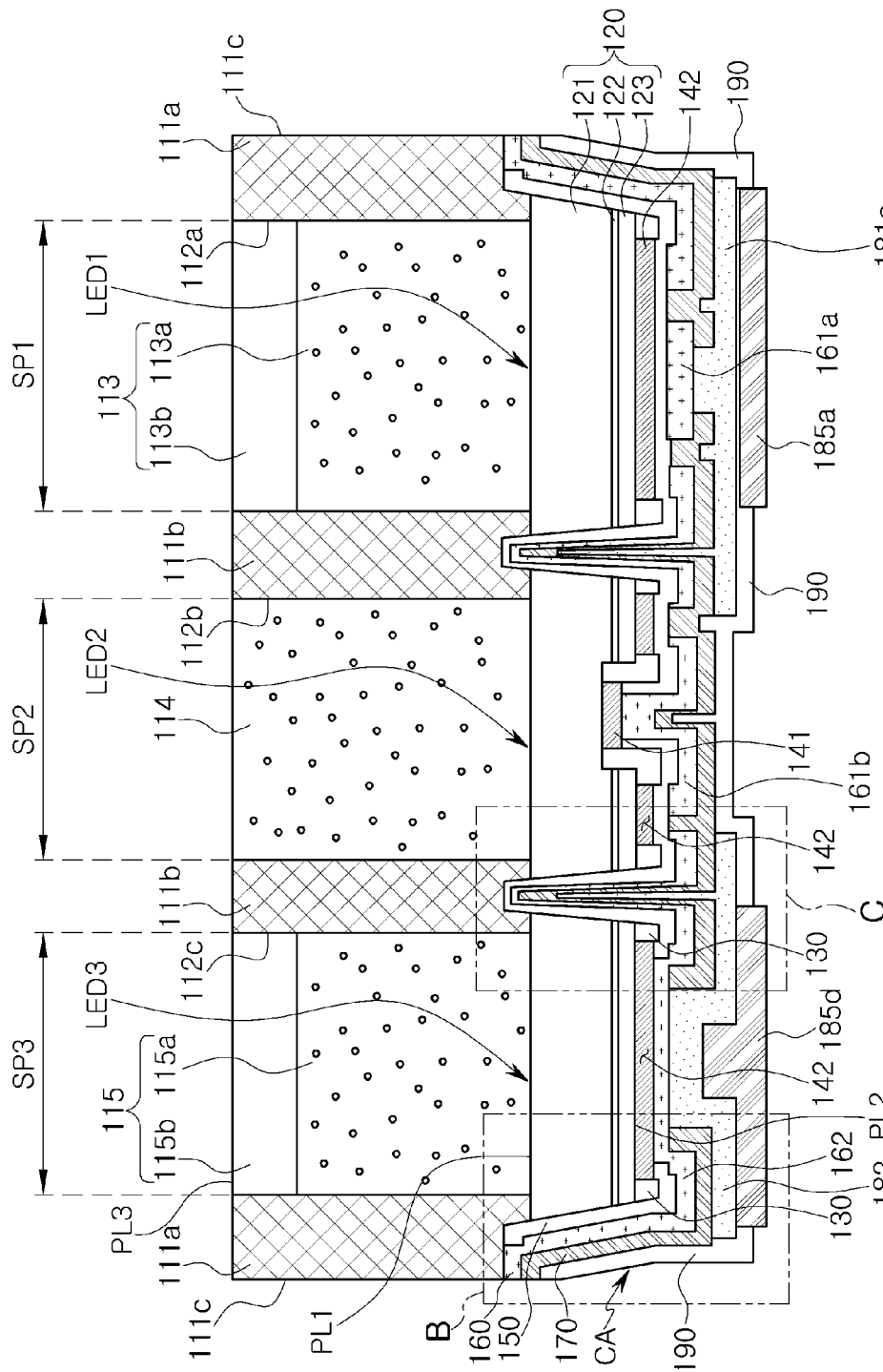
FIG. 4 is a side cross-sectional view taken along line I-I' of FIG. 3, according to some embodiments.

FIG. 2 is an enlarged plan view illustrating the display panel illustrated in FIG. 1, in detail, portion A of the light emitting device module 10, and FIG. 3 is an enlarged plan view illustrating the light emitting device package 100 of FIG. 2. FIG. 4 is an exemplary side cross-sectional view taken along line I-I' of FIG. 3.

With reference to FIG. 2, each of the plurality of light emitting device packages 100 may be disposed to be surrounded by a second molding part 51, which may also be referred to as a frame. The second molding part 51 may be formed using a black matrix. While a region surrounded by the second molding part 51 is provided as a light-emitting region in which the light emitting device package 100 is disposed, an external region of the second molding part 51 may be a non-light-emitting region. The second molding part 51 allows each light emitting device package 100 to be electrically isolated, whereby each light emitting device package 100 may be driven independently from each other as a single pixel.

With reference to FIG. 3, each light emitting device package 100 forming a single pixel may include a first sub-pixel SP1, a second sub-pixel SP2, and a third sub-pixel SP3. The first sub-pixel SP1, the second sub-pixel SP2, and the third sub-pixel SP3 may be disposed to be surrounded by a partition structure 111. In an example embodiment as illustrated in FIG. 3, a form in which three sub-pixels are disposed on a single light emitting device package 100 is exemplified for convenience of description, but two or four sub-pixels may be disposed.

With reference to FIGS. 3 and 4, the light emitting device package 100 according to an example embodiment may include a cell array CA including a first semiconductor light-emitting unit LED1, a second semiconductor light-emitting unit LED2, and a third semiconductor light-emitting unit LED3, an insulating layer 150 covering the first semiconductor light-emitting unit LED1, the second semiconductor light-emitting unit LED2, and the third semiconductor light-emitting unit LED3, a metal support layer 160 supporting the first semiconductor light-emitting unit LED1, the second semiconductor light-emitting unit LED2, and the third semiconductor light-emitting unit LED3 while covering the insulating layer 150, a first wavelength conversion unit 113, a second wavelength conversion unit 114, and a third wavelength conversion unit 115 disposed on the cell array CA, and the partition structure 111 disposed to isolate the first wavelength conversion unit 113, the second wavelength conversion unit 114, and the third wavelength conversion unit 115 from each other.

The cell array CA may include the first semiconductor light-emitting unit LED1, the second semiconductor light-emitting unit LED2, and the third semiconductor light-emitting unit LED3, and may have a first surface PL1 (e.g., at a first vertical height) and a second surface PL2 (e.g., at a second vertical height) opposing each other (e.g., the first surface PL1 and the second surface PL2 facing opposite directions). The first semiconductor light-emitting unit LED1, the second semiconductor light-emitting unit LED2, and the third semiconductor light-emitting unit LED3 are disposed to be in contact with the first surface PL1, and the first wavelength conversion unit 113, the second wavelength conversion unit 114, and the third wavelength conversion unit 115 may be formed to be directly in contact with the first semiconductor light-emitting unit LED1, the second semiconductor light-emitting unit LED2, and the third semiconductor light-emitting unit LED3, respectively. Each individual one of the first to third semiconductor light emitting units LED1 to LED3 may also be referred to as semiconductor light emitting source.

The first semiconductor light-emitting unit LED1, the second semiconductor light-emitting unit LED2, and the third semiconductor light-emitting unit LED3 may emit the same light or different light. For example, the first semiconductor light-emitting unit LED1, the second semiconductor light-emitting unit LED2, and the third semiconductor light-emitting unit LED3 may emit the same blue light (for example, light having wavelengths of 440 nm to 460 nm) or ultraviolet light (for example, light having wavelengths of 380 nm to 440 nm), or may emit red light, green light, and blue light, respectively. In an example embodiment, by way of example, the case in which the first semiconductor light-emitting unit LED1, the second semiconductor light-emitting unit LED2, and the third semiconductor light-emitting unit LED3 emit blue light is described.

Each of the first semiconductor light-emitting unit LED1, the second semiconductor light-emitting unit LED2, and the third semiconductor light-emitting unit LED3 may have a light emitting structure 120 on which a first conductivity-type semiconductor layer 121, an active layer 122, and a second conductivity-type semiconductor layer 123 are sequentially stacked.

The first conductivity-type semiconductor layer 121 and the second conductivity-type semiconductor layer 123 may be a p-type semiconductor layer and an n-type semiconductor layer, respectively. For example, the first conductivity-type semiconductor layer and the second conductivity-type semiconductor layer may be formed of a nitride semiconductor represented by an empirical formula $Al_xIn_yGa_{(1-x-y)}N$ (where, $0 \le x \le 1$, $0 \le y \le 1$, $0 \le x+y \le 1$), but is not limited thereto, and a GaAs-based semiconductor or a GaP-based semiconductor may be used. The active layer 122 may have a multiple quantum well (MQW) structure in which a quantum well layer and a quantum barrier layer are alternately stacked. For example, the active layer 122 may have a nitride-based MQW such as InGaN/GaN or GaN/AlGaN, but is not limited thereto, and a different semiconductor such as GaAs/AlGaAs, InGaP/GaP, or GaP/AlGaP may be used.

Active layers 122 of the first semiconductor light-emitting unit LED1, the second semiconductor light-emitting unit LED2, and the third semiconductor light-emitting unit LED3 may be configured to emit light having different wavelengths. Conditions of emitted light may be implemented in various methods. In an example embodiment, the active layers 122 of the first semiconductor light-emitting unit LED1, the second semiconductor light-emitting unit LED2, and the third semiconductor light-emitting unit LED3 may be configured to emit light having different colors, or may be configured to emit light having the same color. For example, the active layers 122 may emit red light, green light, and blue light, respectively, or may emit the same blue light or ultraviolet light.

The first conductivity-type semiconductor layer 121 and the second conductivity-type semiconductor layer 123 may be electrically connected to a first electrode 141 and a second electrode 142, respectively. The first electrode 141 and the second electrode 142 may be disposed on mesa-etched regions of the first conductivity-type semiconductor layer 121 and the second conductivity-type semiconductor layer 123, respectively. For example, the first electrode 141 may be formed using at least one of aluminum (Al), gold (Au), chromium (Cr), nickel (Ni), titanium (Ti), and tin (Sn), and the second electrode 142 may be formed using a reflective metal. For example, the second electrode 142 may be formed using a material such as silver (Ag), Ni, Al, Cr, rhodium (Rh), palladium (Pd), iridium (Ir), ruthenium (Ru), magnesium (Mg), zinc (Zn), platinum (Pt), Au or the like, and may have a monolayer structure or a multilayer structure.

Insulating mask layers 130 are disposed on the second surface PL2 of the cell array CA to define regions in which the first electrode 141 and the second electrode 142 of the first semiconductor light-emitting unit LED1, the second semiconductor light-emitting unit LED2, and the third semiconductor light-emitting unit LED3 are individually disposed.

The insulating layer 150 may be disposed on a surface of each of the first semiconductor light-emitting unit LED1, the second semiconductor light-emitting unit LED2, and the third semiconductor light-emitting unit LED3 of the cell array CA. The insulating layer 150 may be disposed to cover a surface of each of the first semiconductor light-emitting unit LED1, the second semiconductor light-emitting unit LED2, and the third semiconductor light-emitting unit LED3 to electrically isolate light emitting structures 120 of the first semiconductor light-emitting unit LED1, the second semiconductor light-emitting unit LED2, and the third semiconductor light-emitting unit LED3 from each other. A first opening 151 and a second opening 152 may be disposed in one region of the insulating layer 150 to define regions in which the first electrode 141 and the second electrode 142 are individually connected. The first electrode 141 and the second electrode 142 may be connected to first regions 161a, 161b, and 161c as well as a second region 162, of the metal support layer 160, which will be described later, through the first opening 151 and the second opening 152.

Figure 5:
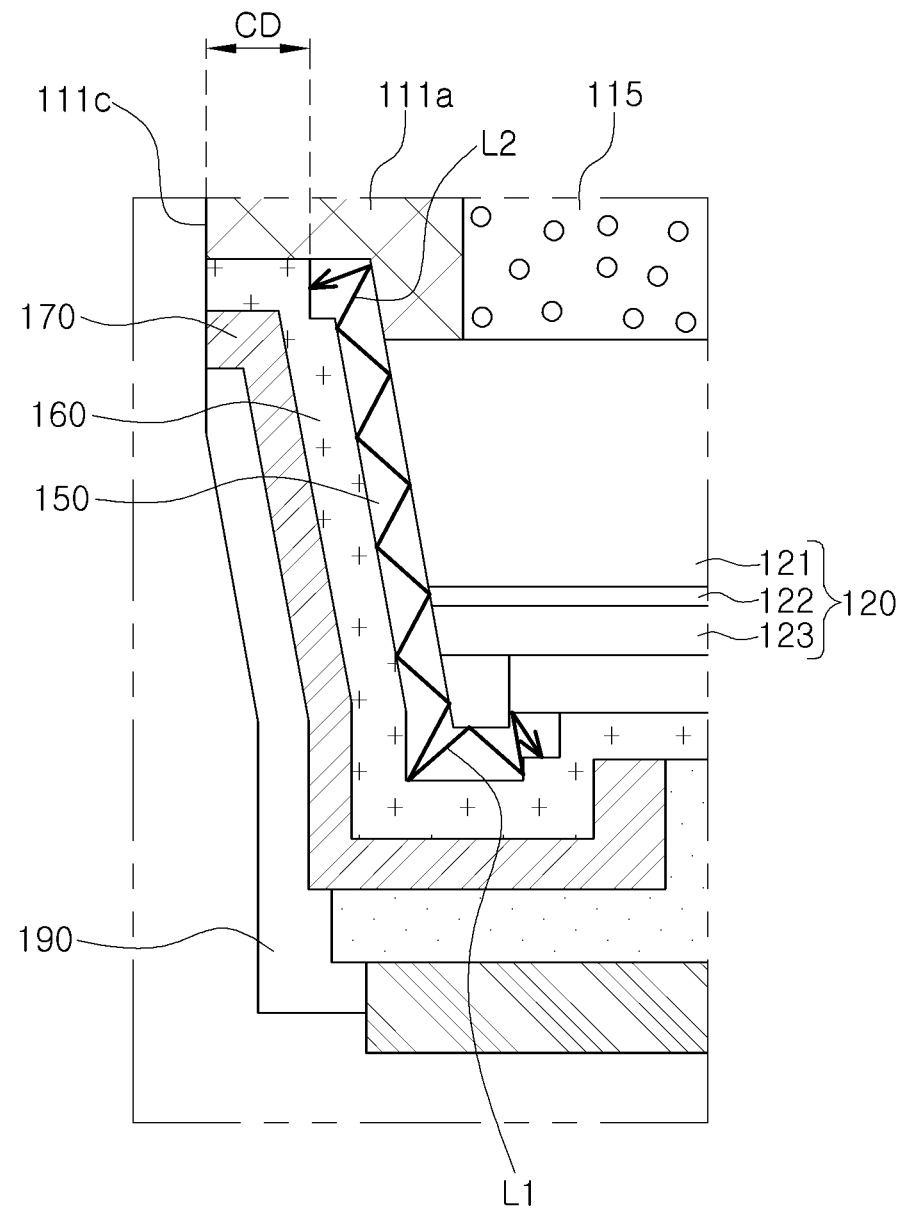
FIGS. 5 and 6 are enlarged drawings of portion B and portion C of FIG. 4, according to some embodiments, respectively, to illustrate a light leakage preventing effect of a metal support layer.

As illustrated in FIG. 5, the insulating layer 150 has a region disposed to be extended from an edge region 111a of the partition structure 111, and a lateral surface of the insulating layer 150 may be disposed to be spaced apart from an outer lateral surface 111c of a substrate for growth having a plurality of light-emitting windows, for example, a first light-emitting window 112a corresponding to the first light-emitting unit LED1, a second light-emitting window 112b corresponding to the second light-emitting unit LED2, and a third light-emitting window 112c corresponding to the third light-emitting unit LED3, defined by the partition structure 111 by a predetermined width CD. In some exemplary embodiments, each semiconductor light-emitting unit (e.g., LED1, LED2, and LED3 as illustrated in FIG. 4) corresponding to respective light-emitting window includes a first surface PL1 at a first vertical height and a second surface PL2 opposite the first surface PL1 at a second vertical height. The first surface PL1 of each semiconductor light-emitting unit contacts the substrate for growth.

The insulating layer 150 may be formed of a silicon oxide or a silicon nitride, for example, $SiO_2$, $SiO_xN_y$, $Si_xN_y$ or the like. Such a material has relatively high light reflectivity, but does not have 100% light reflectivity. Thus, a phenomenon in which a portion of light emitted by the active layer 122, incident through a surface of the insulating layer 150, may occur. Light incident through the insulating layer 150 may be emitted by a region of the insulating layer 150, exposed externally. Thus, in the case in which a region of the insulating layer 150 is exposed to a lateral surface of the light emitting device package 100, light may be directly emitted externally without passing through the third wavelength conversion unit 115. For example, when the light emitting device package 100 is viewed from a side, a light leakage defect, in which light of the active layer 122 whose wavelength is not converted, leaks, may occur. In the case in which the display panel 1 is manufactured using the light emitting device package 100 in which the light leakage defect occurs, when viewed obliquely from a front of the display panel 1, a problem in which light whose wavelength has not been converted may be seen may occur. In an example embodiment, an edge portion of the insulating layer 150 may be disposed to be spaced apart from the outer lateral surface 111c of the edge region 111a of the partition structure 111 by a predetermined width CD, and may be covered by the metal support layer 160 to be described later. Thus, portions of light L1 and L2 emitted by the active layer 122 may be prevented from being emitted outside of the light emitting device package 100 to cause a light leakage defect. The predetermined width CD by which the insulating layer 150 is spaced apart from the outer lateral surface, may be prepared to be greater than a thickness of the metal support layer 160, thereby providing sufficient space to allow the metal support layer 160 to cover an edge of the insulating layer 150.

Figure 6:
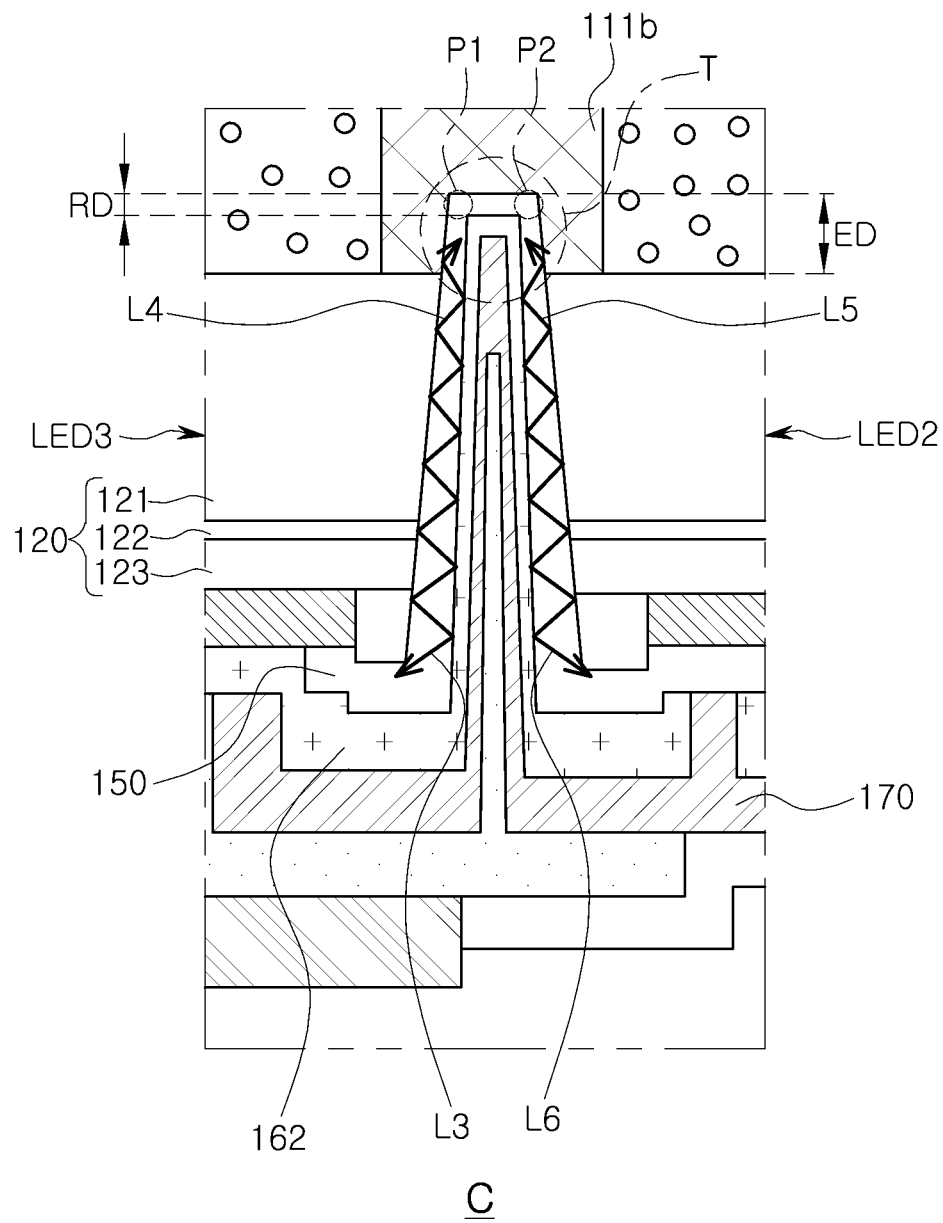

As illustrated in FIGS. 4 and 6, when a trench T having a depth ED greater than a thickness RD of the insulating layer 150 is formed on a surface of a middle region 111b of the partition structure 111 disposed between the light emitting structures 120 of the first semiconductor light-emitting unit LED1, the second semiconductor light-emitting unit LED2, and the third semiconductor light-emitting unit LED3, an optical path of the insulating layer 150 disposed on a surface of the light emitting structures 120 of the first semiconductor light-emitting unit LED1, the second semiconductor light-emitting unit LED2, and the third semiconductor light-emitting unit LED3 becomes long. Portions of light L3 and L4 emitted by a semiconductor light-emitting unit, the third semiconductor light-emitting unit LED3, may be prevented from flowing in a different semiconductor light-emitting unit adjacent thereto, the second semiconductor light-emitting unit LED2, to be color-mixed with portions of light L5 and L6 of the semiconductor light-emitting unit adjacent thereto, the second semiconductor light-emitting unit LED2. In detail, as the insulating layer 150 between the third semiconductor light-emitting unit LED3 and the second semiconductor light-emitting unit LED2 is disposed along an inner surface of the trench T, an optical path of portions of light L4 and L5 of light emitted by the active layer 122, toward a semiconductor light-emitting unit adjacent thereto may be bent at two points, P1 and P2. Thus, portions of light L3 and L4 emitted by the third semiconductor light-emitting unit LED3 and portions of light L5 and L6 emitted by the second semiconductor light-emitting unit LED2 may be blocked from each other.

The metal support layer 160 may cover a region including an edge region of the insulating layer 150, and may be formed using a metallic material such as copper (Cu), Au, or Al, having high reflectivity and flexibility. Thus, the metal support layer 160 may prevent light from leaking through the insulating layer 150 to prevent a light leakage defect of a light emitting device package. In addition, the metal support layer may absorb an external force applied to the first semiconductor light-emitting unit LED1, the second semiconductor light-emitting unit LED2, and the third semiconductor light-emitting unit LED3 to mitigate damage to the first semiconductor light-emitting unit LED1, the second semiconductor light-emitting unit LED2, and the third semiconductor light-emitting unit LED3. In addition, the metal support layer may reflect light emitted by the active layer 122 in a direction of the first wavelength conversion unit 113 to further improve external light extraction efficiency of the light emitting device package 100. The metal support layer 160 may be disposed to have a predetermined thickness not allowing light emitted by the insulating layer 150 to be transmitted therethrough. For example, the metal support layer 160 may have a thickness of about 100 nm or more.

As illustrated in FIGS. 3 and 4, the metal support layer 160 may include the plurality of first regions 161a, 161b, and 161c connected to first electrodes 141 through first openings 151 of the insulating layer 150, and the second region 162 commonly connected to a plurality of second electrodes 142 through the second opening 152 of the insulating layer 150. In an example embodiment, the second region 162 may be disposed to surround the plurality of first regions 161a, 161b, and 161c, and the plurality of first regions 161a, 161b, and 161c may be disposed to have the same area.

An interlayer insulating layer 170 may be disposed on the metal support layer 160 to define a region in which the metal support layer 160 is in contact with first pad parts 181a, 181b, and 181c as well as a second pad part 182 described later. The interlayer insulating layer 170 may be formed of the same material as that of the insulating layer 150, but is not limited thereto. In the interlayer insulating layer 170, first openings 171a, 171b, and 171c as well as a second opening 172 may be disposed therein to define a region in which the first regions 161a, 161b, and 161c as well as the second region 162 of the metal support layer 160 are in contact with the first pad parts 181a, 181b, and 181c as well as the second pad part 182, respectively.

The first pad parts 181a, 181b, and 181c as well as the second pad part 182 may be disposed on the interlayer insulating layer 170, and a passivation layer 190 covering the interlayer insulating layer 170, the first pad parts 181a, 181b, and 181c as well as the second pad part 182 and having first openings 191a, 191b, and 191c as well as a second opening 192 may be disposed thereon. In an example embodiment, the passivation layer 190 may be formed using physical enhanced oxidation (PEOX). In addition, according to an example embodiment, the passivation layer 190 may include light reflective particles for reflecting light. For the light reflective particles, titanium dioxide ($TiO_2$) or aluminum oxide ($Al_2O_3$) may be used, but an example embodiment is not limited thereto.

The partition structure 111 in which the first wavelength conversion unit 113, the second wavelength conversion unit 114, and the third wavelength conversion unit 115 are disposed to be isolated from each other may be disposed on the first surface PL1 of the cell array CA. The partition structure 111 as well as the first to third wavelength conversion units 113 to 115 may extend between the first surface PL1 and a third surface PL3 at a third vertical height. As such, the partition structure 111 and the first to third wavelength conversion units 113 to 115 may have a first surface at the first vertical height (e.g., the first surface PL1) and a second surface at the third vertical height (e.g., the third surface PL3).

The partition structure 111 may be disposed to be in contact with the first surface PL1 of the cell array CA, and may have a first light-emitting window 112a, a second light-emitting window 112b, and a third light-emitting window 112c in positions corresponding to the first semiconductor light-emitting unit LED1, the second semiconductor light-emitting unit LED2, and the third semiconductor light-emitting unit LED3. The first light-emitting window 112a, the second light-emitting window 112b, and the third light-emitting window 112c may be provided as spaces for formation of the first wavelength conversion unit 113, the second wavelength conversion unit 114, and the third wavelength conversion unit 115, respectively. The partition structure 111 may include a light blocking material allowing portions of light passing through the first wavelength conversion unit 113, the second wavelength conversion unit 114, and the third wavelength conversion unit 115 not to interfere with each other. In addition, the partition structure 111 may be formed by etching a wafer used as a substrate for growth for growing the first semiconductor light-emitting unit LED1, the second semiconductor light-emitting unit LED2, and the third semiconductor light-emitting unit LED3. The partition structure 111 may be disposed to surround a lateral surface of the first wavelength conversion unit 113, the second wavelength conversion unit 114, and the third wavelength conversion unit 115, to isolate the first wavelength conversion unit 113, the second wavelength conversion unit 114, and the third wavelength conversion unit 115 from each other.

The first wavelength conversion unit 113, the second wavelength conversion unit 114, and the third wavelength conversion unit 115 may convert light emitted by the first semiconductor light-emitting unit LED1, the second semiconductor light-emitting unit LED2, and the third semiconductor light-emitting unit LED3 into light having different colors by adjustment. In an example embodiment, the first wavelength conversion unit 113, the second wavelength conversion unit 114, and the third wavelength conversion unit 115 may be configured to provide red light, blue light, and green light, respectively. The wavelength conversion units (e.g., LED1, LED2, LED3) described herein are also referred to as wavelength conversion pillars (e.g., first, second, third, etc., pillars), or wavelength conversion layers (e.g., first, second, third, etc., layers).

In an example embodiment, when the first semiconductor light-emitting unit LED1, the second semiconductor light-emitting unit LED2, and the third semiconductor light-emitting unit LED3 emit blue light, the first wavelength conversion unit 113 and the third wavelength conversion unit 115 may include a red phosphor and a green phosphor, respectively. The first wavelength conversion unit 113 and the third wavelength conversion unit 115 may be formed by dispensing a light-transmitting liquid resin, with which a wavelength conversion material such as a red phosphor or a green phosphor is mixed, into the first light-emitting window 112a and the third light-emitting window 112c, but may be formed in various different processes. For example, the first wavelength conversion unit and the third wavelength conversion unit may be provided as a wavelength conversion film.

As required, the first wavelength conversion unit 113 and the third wavelength conversion unit 115 may further include optical filter layers 113b and 115b for selectively blocking blue light, respectively. By using the optical filter layers 113b and 115b, the first light-emitting window 112a and the third light-emitting window 112c may provide only desired red light and green light.

In an example embodiment, when the first semiconductor light-emitting unit LED1, the second semiconductor light-emitting unit LED2, and the third semiconductor light-emitting unit LED3 emit blue light, the second wavelength conversion unit 114 may not include a phosphor. Thus, the second wavelength conversion unit 114 may provide blue light the same as blue light emitted by the first semiconductor light-emitting unit LED1.

The second wavelength conversion unit 114 may be formed by dispensing a light-transmitting liquid resin with which a phosphor is not mixed. However, according to an example embodiment, the second wavelength conversion unit 114 may include a blue or blue green (for example, 480 nm to 520 nm) phosphor for adjusting color coordinates of blue light. The phosphor is adopted for a purpose for adjusting color coordinates of blue light which may be provided by the second wavelength conversion unit 114. Thus, a smaller amount of a phosphor may be mixed, as compared to an amount of a phosphor mixed with the first wavelength conversion unit 113 and the third wavelength conversion unit 115 for conversion of a color of light.

In an example embodiment, a display device including a display panel having a circuit board and a plurality of light emitting device packages disposed on the circuit board in rows and columns, a panel driving unit for driving the display panel, and a control unit for controlling the panel driving unit, may be provided. A light emitting device package includes a plurality of light emitting structures, each of the plurality of light emitting structures having a first conductivity-type semiconductor layer, an active layer, and a second conductivity-type semiconductor layer, and may include a cell array having a first surface and a second surface positioned in the opposite side to the first surface, a plurality of wavelength conversion units disposed to correspond to the plurality of light emitting structure, respectively, on the first surface of the cell array, and configured to provide light having a wavelength different from light emitted by the plurality of light emitting structures, a partition structure surrounding the plurality of wavelength conversion units to isolate the plurality of wavelength conversion units from each other, an insulating layer extended to the first surface from the second surface to divide the light-emitting structure into the plurality of light-emitting regions, and disposed to be spaced apart from an outer lateral surface of the partition structure by a predetermined width, and a metal support layer covering a region including an edge of the insulating layer.

Also, according to these exemplary embodiments, a light emitting device package includes a cell array, including a plurality of semiconductor light-emitting units, each semiconductor light-emitting unit having a first surface at a first vertical height and a second surface opposite the first surface at a second vertical height, and each semiconductor light emitting unit including a first conductivity-type semiconductor layer, an active layer, and a second conductivity-type semiconductor layer stacked on each other. The light emitting device package further includes a plurality of wavelength conversion units disposed respectively on the plurality of semiconductor light-emitting units, each wavelength conversion unit having a first surface at the first vertical height and a second surface at a third vertical height, wherein the first vertical height is between the second vertical height and the third vertical height, each wavelength conversion unit is configured to convert a wavelength of light, emitted by a respective one of the plurality of semiconductor light emitting units, into a different wavelength of light. The light emitting device package further includes a metal support layer disposed on at least one surface of the plurality of semiconductor light-emitting units and having a lateral surface coplanar with a lateral surface of the substrate for growth and an insulating layer disposed between the plurality of semiconductor light-emitting units and the metal support layer. The light emitting device package further includes a partition structure disposed in a space between the plurality of wavelength conversion units so as to separate the plurality of wavelength conversion units from each other, the partition structure extending between the first vertical height and the third vertical height.

A method of manufacturing a light emitting device package according to an example embodiment will be described.

FIGS. 7A to 14B are side cross-sectional views schematically illustrating a main manufacturing process of a light emitting device package. In detail, a method of manufacturing the light emitting device package may be a method of manufacturing a wafer level chip scale package. Hereafter, the main manufacturing process is illustrated based on a single light emitting device package in a portion of a chip scale packaging process for easier understanding.

Figure 7A:
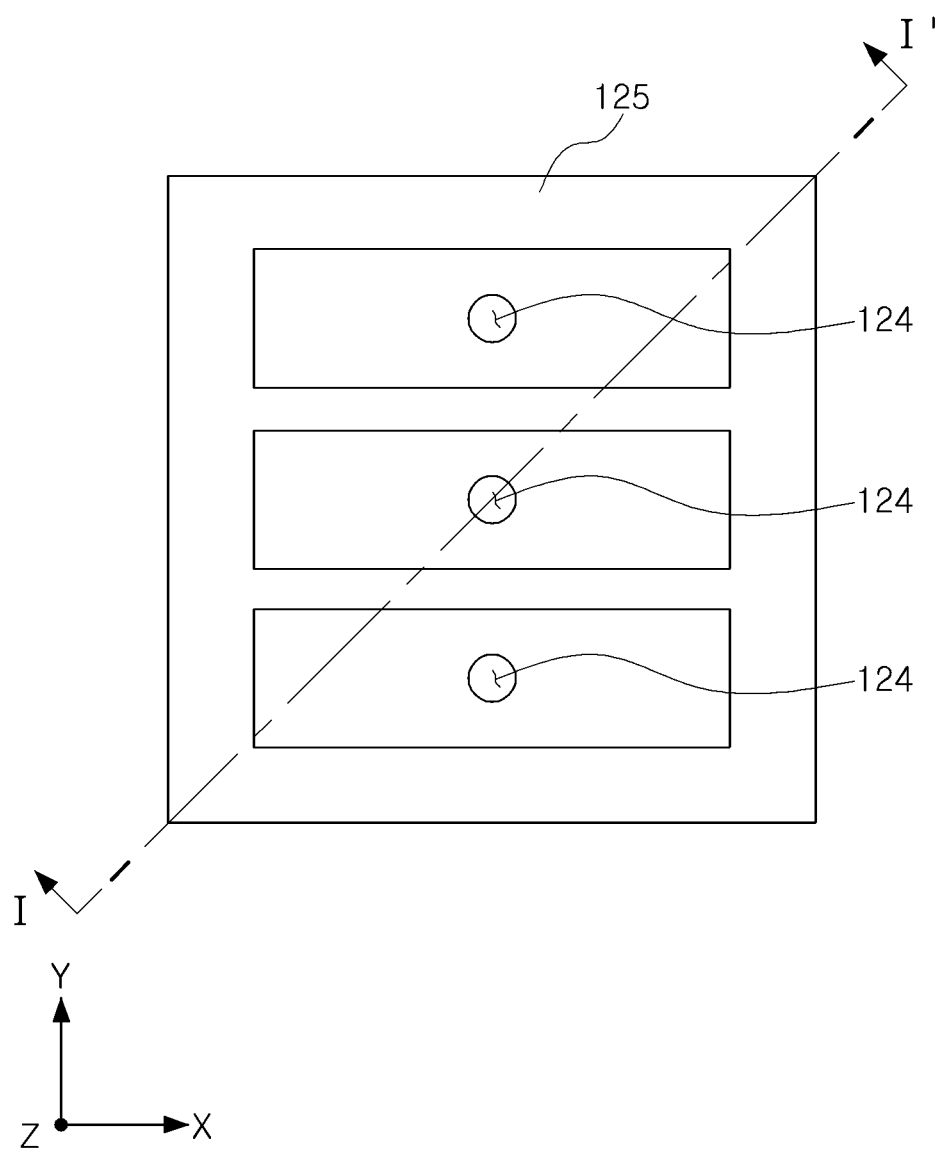
Figure 7B:
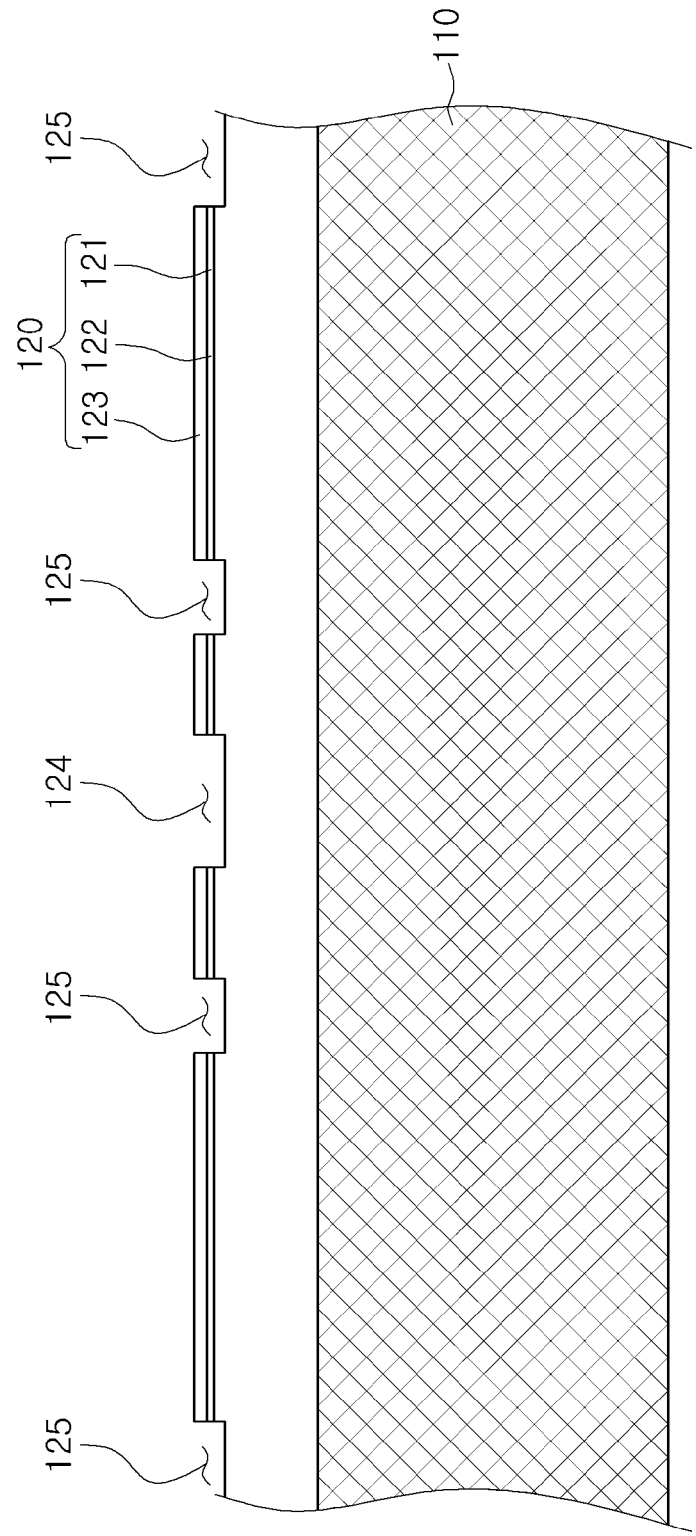

With reference to FIGS. 7A and 7B, a process of manufacturing a light emitting device package may be initiated by a step of forming the light emitting structure 120 including the first conductivity-type semiconductor layer 121, the active layer 122, and the second conductivity-type semiconductor layer 123 on a substrate for growth 110 and mesa-etching a region of the light emitting structure 120.

The substrate for growth 110 may be an insulative, conductive, or semiconductive substrate as required. The substrate for growth 110 may be, for example, a semiconductor substrate for formation of the light emitting structure 120 in one surface. The first conductivity-type semiconductor layer 121 may be, for example, an n-type nitride semiconductor represented by an empirical formula $In_xAl_yGa_{1-x-y}N$ (where $0 \leq x < 1$, $0 \leq y < 1$, and $0 \leq x+y < 1$), and an n-type impurity may be, for example, silicon (Si), germanium (Ge), selenium (Se), tellurium (Te) or the like. In addition, the active layer 122 may have a multiple quantum well (MQW) structure in which a quantum well layer and a quantum barrier layer are alternately stacked. For example, the quantum well layer and the quantum barrier layer may have different compositions represented by the empirical formula $In_xAl_yGa_{1-x-y}N$ (where $0 \leq x \leq 1$, $0 \leq y \leq 1$, and $0 \leq x+y \leq 1$). In a specific example, the quantum well layer may be represented by the empirical formula $In_xGa_{1-x}N$ (where $0 < x \leq 1$), and the quantum barrier layer may be GaN or AlGaN. The second conductivity-type semiconductor layer 123 may be a p-type nitride semiconductor represented by an empirical formula $In_xAl_yGa_{1-x-y}N$ (where $0 \leq x < 1$, $0 \leq y < 1$, and $0 \leq x+y < 1$), and a p-type impurity may be Mg, zinc (Zn), beryllium (Be) or the like.

Figure 8A:
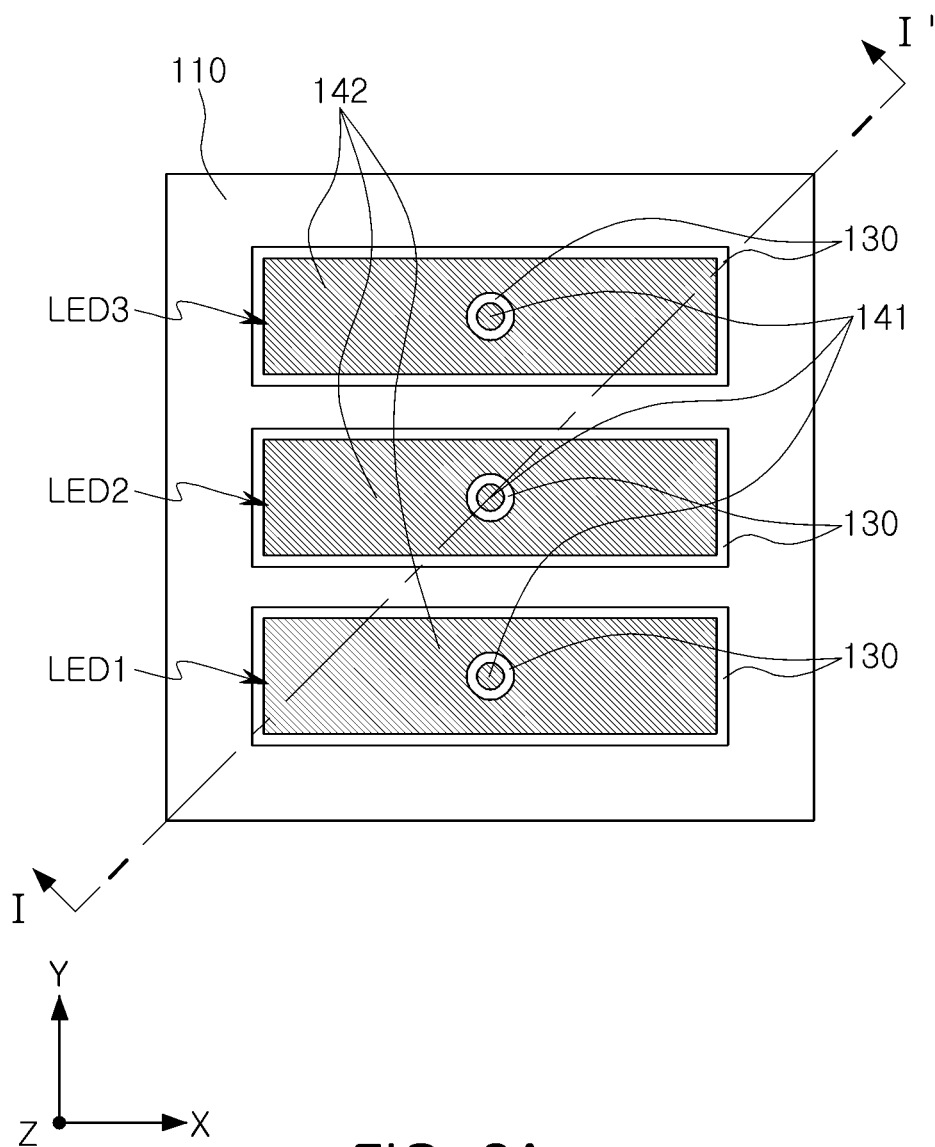
Figure 8B:
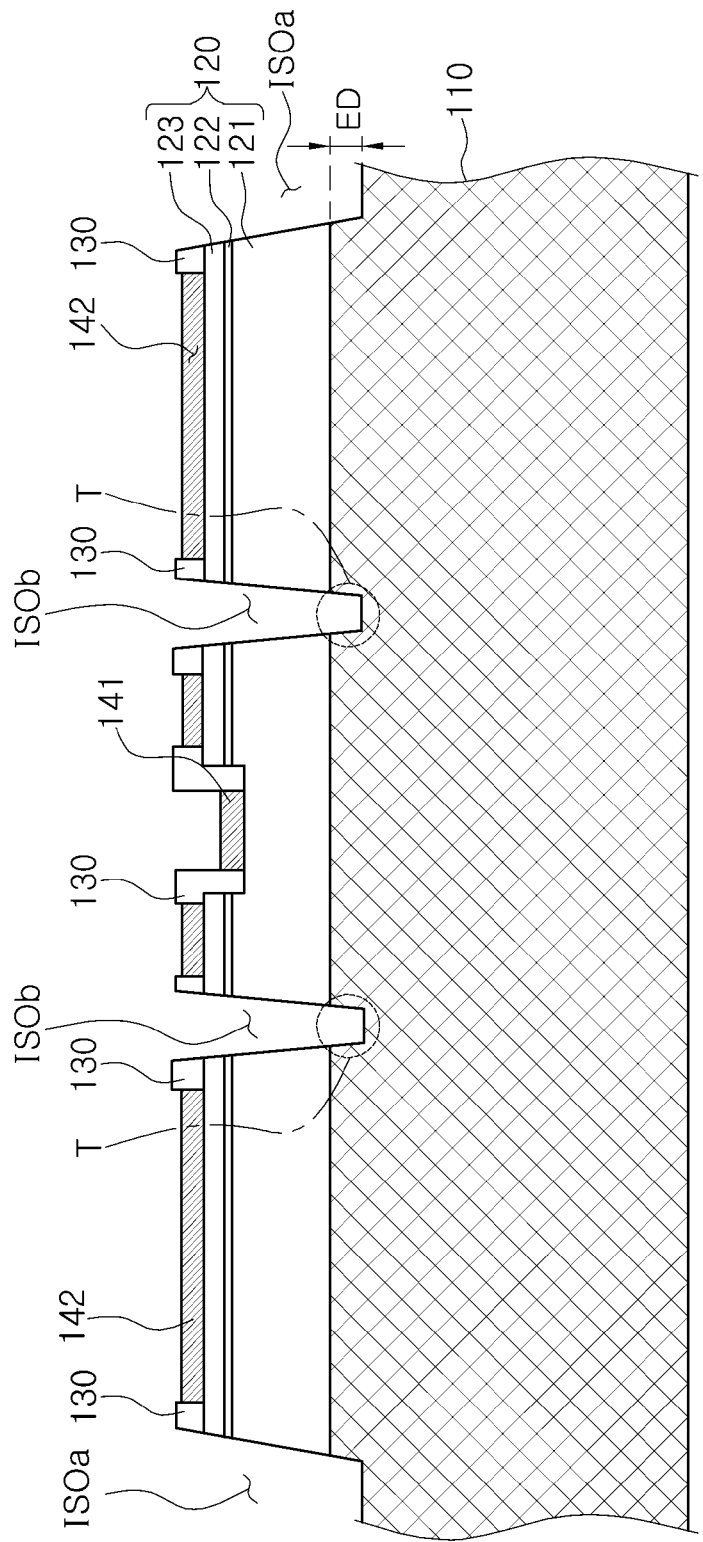

To expose a region of the first conductivity-type semiconductor layer 121, the light emitting structure 120 may be mesa-etched. Such an etching process may be performed as a process of removing a region of the second conductivity-type semiconductor layer 123 and the active layer 122 to form mesa-etched regions 124 and 125. As illustrated in FIGS. 8A and 8B, after the first electrode 141, the second electrode 142, and Insulating mask layers 130 are individually disposed on a plurality of light emitting structures 120, an isolation process of isolating the light emitting structure into a plurality of light-emitting regions, the first semiconductor light-emitting unit LED1, the second semiconductor light-emitting unit LED2, and the third semiconductor light-emitting unit LED3, may be performed.

Isolation regions ISOa and ISOb may be formed to pass through the light emitting structure 120 to expose a surface of the substrate for growth 110. In a process described above, the light emitting structure 120 may be isolated into the plurality of light-emitting regions to be supported by the substrate for growth 110.

An isolation region may include a device isolation region ISOa, a region in which a discrete semiconductor light emitting device package is isolated, and a sub-isolation region ISOb in which a plurality of light-emitting regions are isolated. The device isolation region ISOa may be formed for each of three light-emitting regions, the first semiconductor light-emitting unit LED1, the second semiconductor light-emitting unit LED2, and the third semiconductor light-emitting unit LED3, and the sub-isolation region ISOb may be formed between the three light-emitting regions, the first semiconductor light-emitting unit LED1, the second semiconductor light-emitting unit LED2, and the third semiconductor light-emitting unit LED3. Such an isolation process may be performed in a process of isolating and forming the light emitting structure 120 using a cutting blade, but is not limited thereto. The sub-isolation region ISOb may be formed in a separate process from a process of forming the device isolation region ISOa, but may be formed in the same process as a process of forming the device isolation region ISOa. The sub-isolation region ISOb may have a width narrower than that of the device isolation region ISOa. In addition, in a process described above, a surface of the substrate for growth 110, exposed to the device isolation region ISOa and the sub-isolation region ISOb is removed to form the trench T. A depth ED of the trench T may be greater than a thickness of the insulating layer 150 stacked in a subsequent process.

Figure 9A:
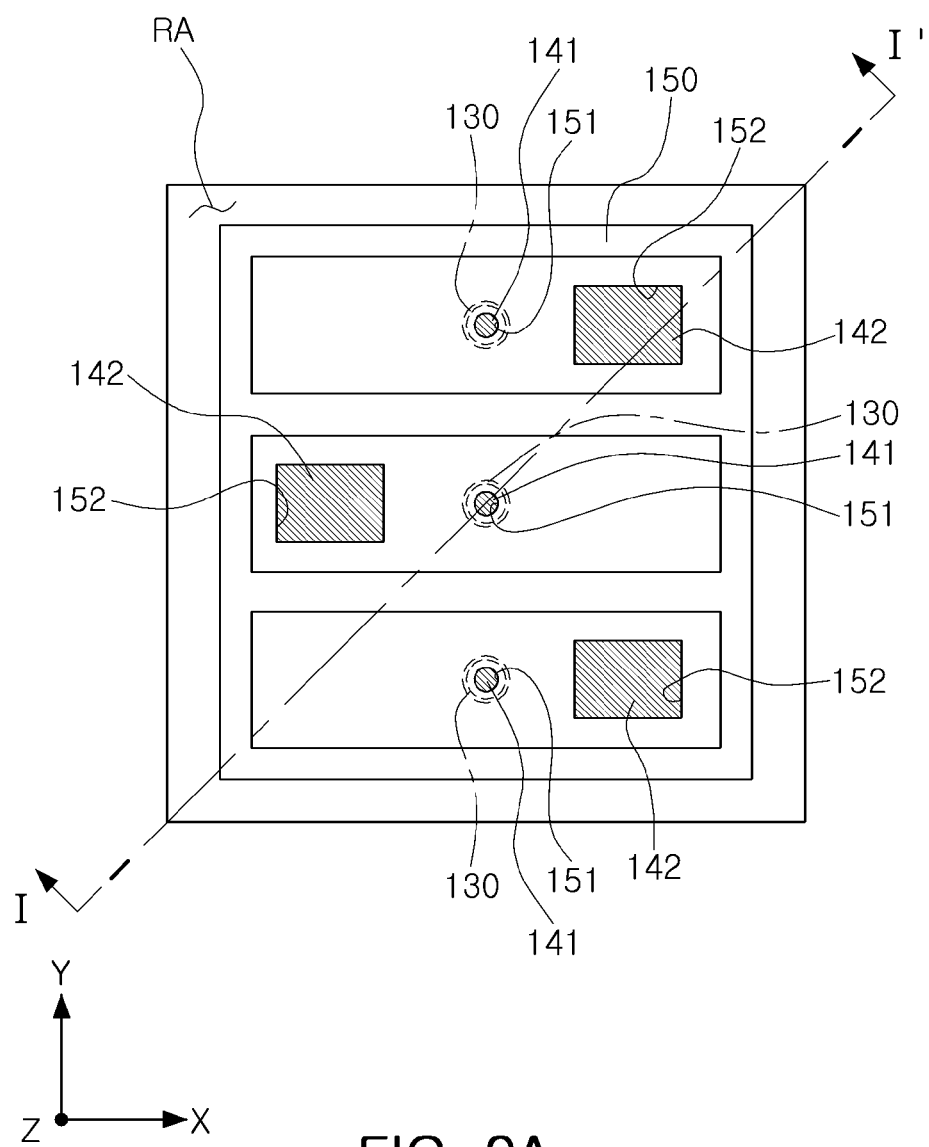
Figure 9B:
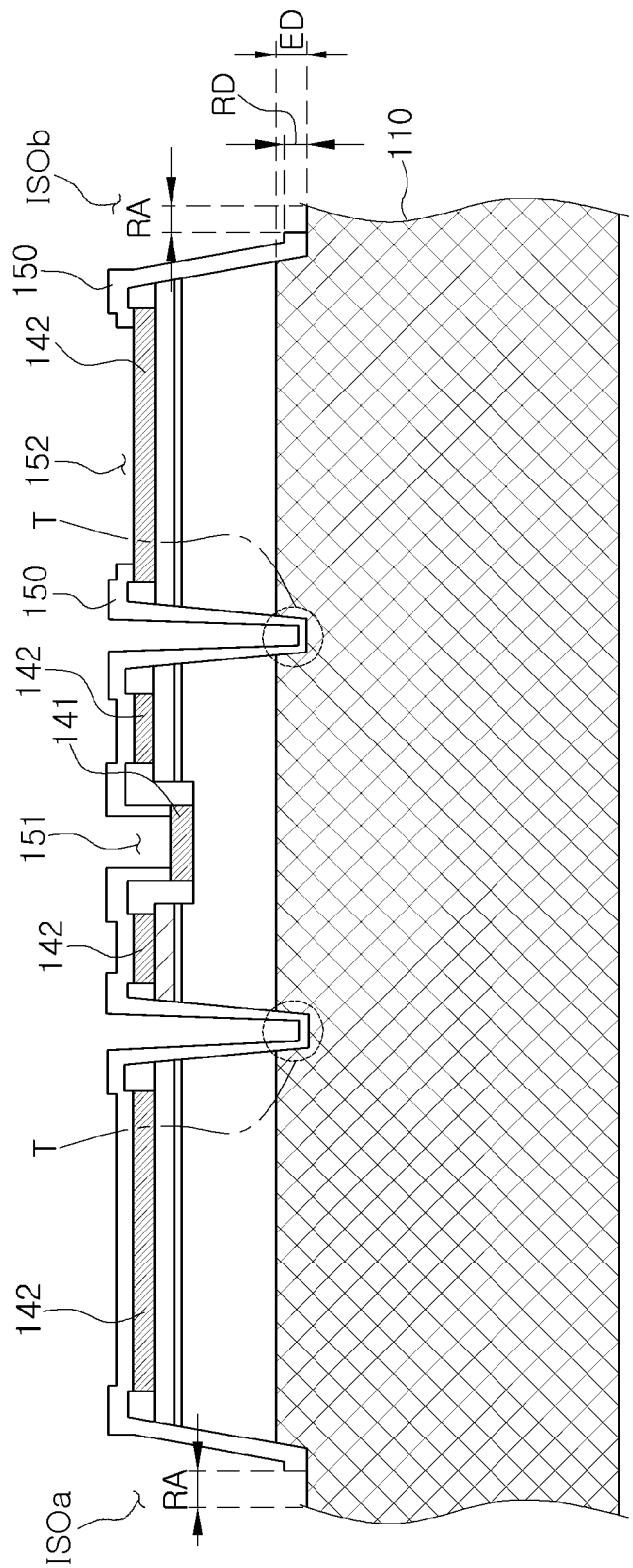

With reference to FIGS. 9A and 9B, the insulating layer 150 may be disposed to cover a surface of the light emitting structure 120 and the substrate for growth 110. In the insulating layer 150, the first opening 151 and the second opening 152 to which the first electrode 141 and the second electrode 142 are exposed, respectively, may be formed. For example, the thickness RD of the insulating layer 150 which is deposited is less than the depth ED of the trench T, whereby light emitted by a single light emitting structure may be prevented from being incident into a different light emitting structure adjacent thereto to be color-mixed. In addition, the insulating layer 150 deposited on the device isolation region ISOa is removed by a predetermined width RA to define a region in which the metal support layer 160 covers the insulating layer 150 in a subsequent process.

Figure 10A:
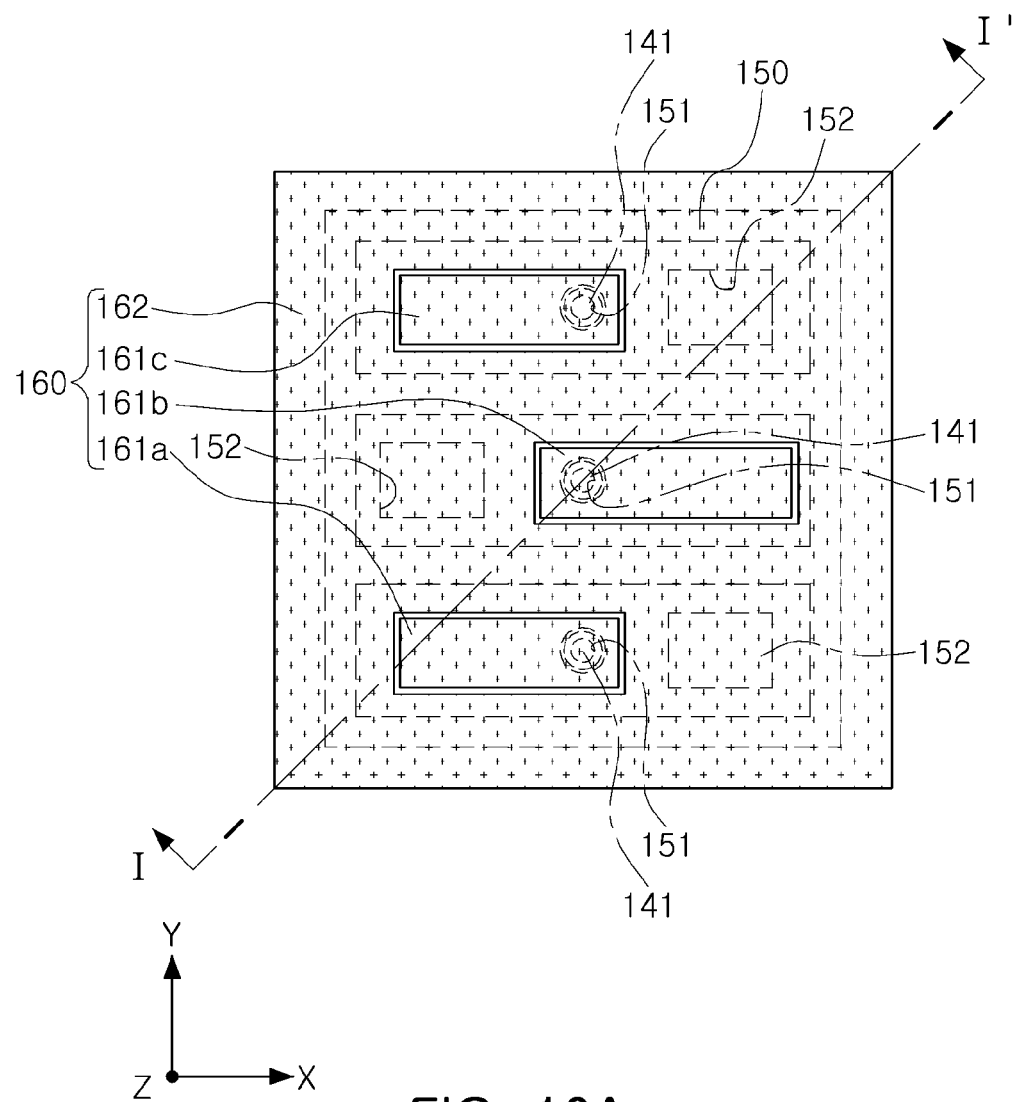
Figure 10B:
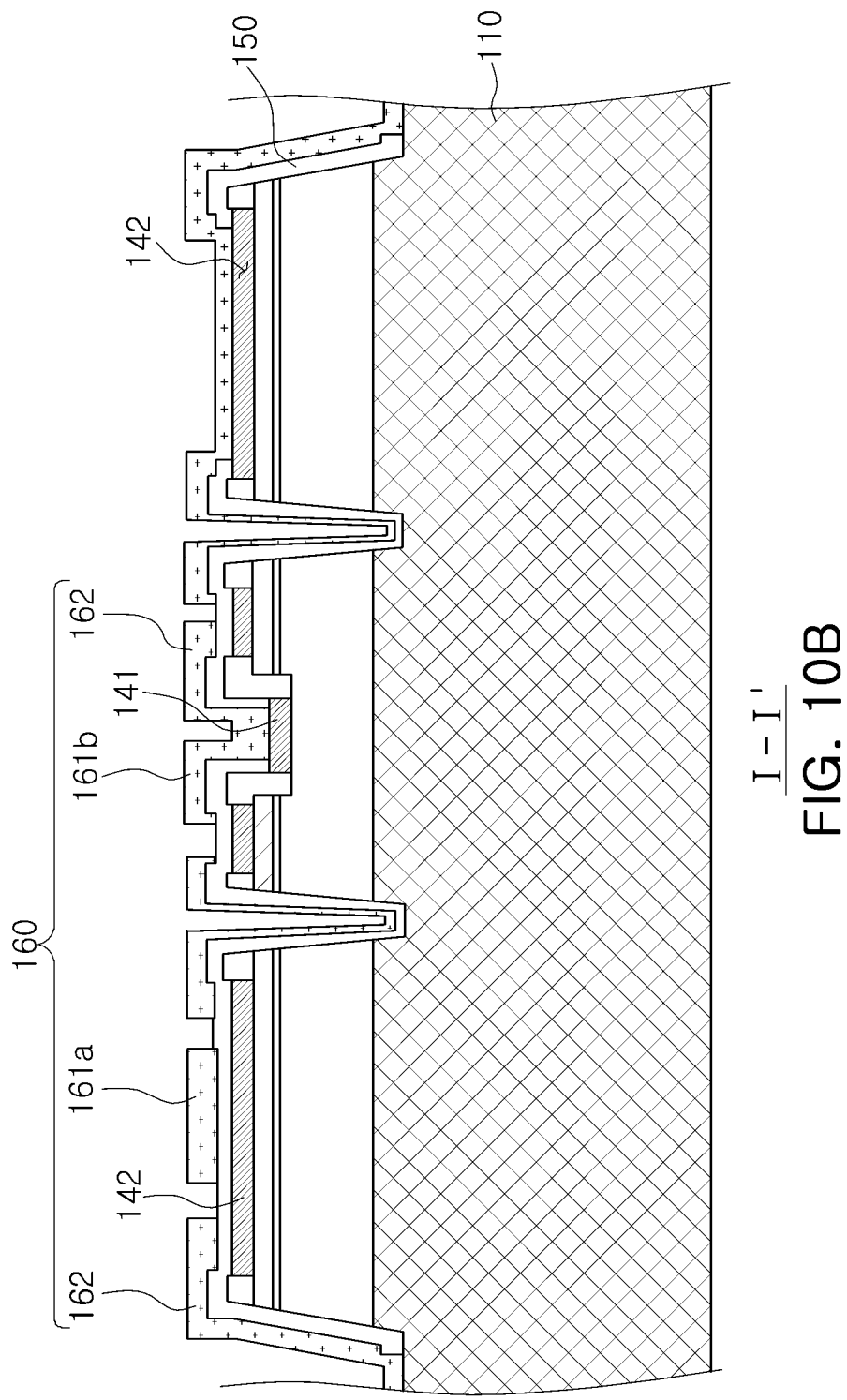

With reference to FIGS. 10A and 10B, the metal support layer 160 may be deposited to cover a region including an edge of the insulating layer 150. The metal support layer 160 may include the plurality of first regions 161a, 161b, and 161c individually connected to a plurality of first electrodes 141 individually disposed on the plurality of light emitting structures, and a second region 162 disposed to be spaced apart from the plurality of first regions 161a, 161b, and 161c and commonly connected to a plurality of second electrodes 142 individually disposed on the plurality of light emitting structures. The plurality of first regions 161a, 161b, and 161c may be disposed to be spaced apart from each other inside the second region 162. The metal support layer 160 may be disposed to cover a region including an edge of the insulating layer 150 to block light leaking through the insulating layer 150. In an example embodiment, the second region 162 may be disposed to cover a region including an edge of the insulating layer 150. The metal support layer 160 may be formed of a metallic material such as Cu, Au, or Al, having high reflectivity and flexibility. Thus, the metal support layer 160 may block light leaking from the insulating layer 150, and may mitigate stress applied to a light emitting structure in a manufacturing process. In addition, the metal support layer 160 may reflect light emitted by the active layer 122 to change an optical path in a direction of a wavelength conversion unit to be described later. Thus, external light extraction efficiency of the light emitting device package 100 may be improved.

Figure 11A:
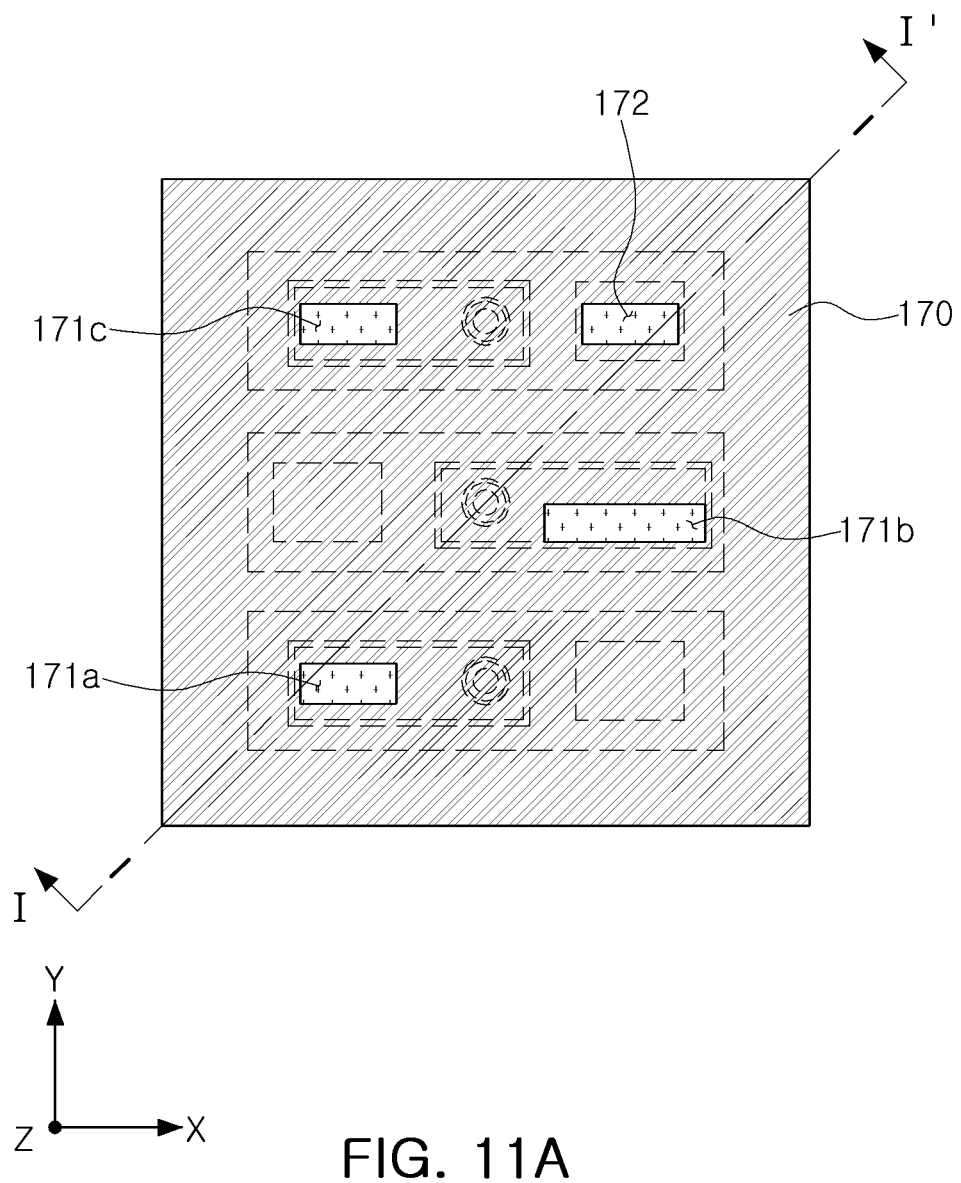
Figure 11B:
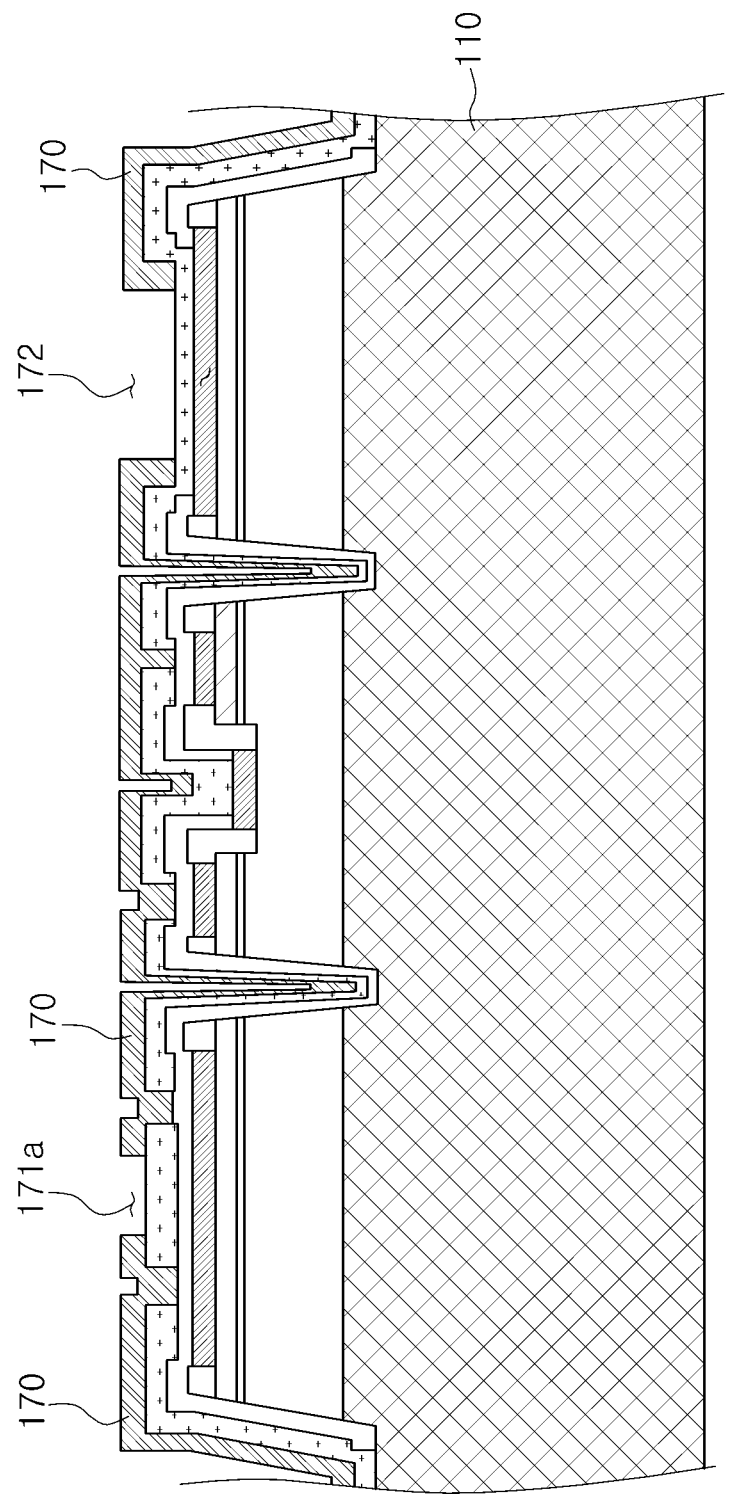

With reference to FIGS. 11A and 11B, the interlayer insulating layer 170 having the first openings 171a, 171b, and 171c as well as the second opening 172 exposing the plurality of first regions 161a, 161b, and 161c as well as the second region 162 of the metal support layer 160, respectively, may be deposited. The interlayer insulating layer 170 may define a region in which a pad electrode formed in a subsequent process is disposed.

Figure 12A:
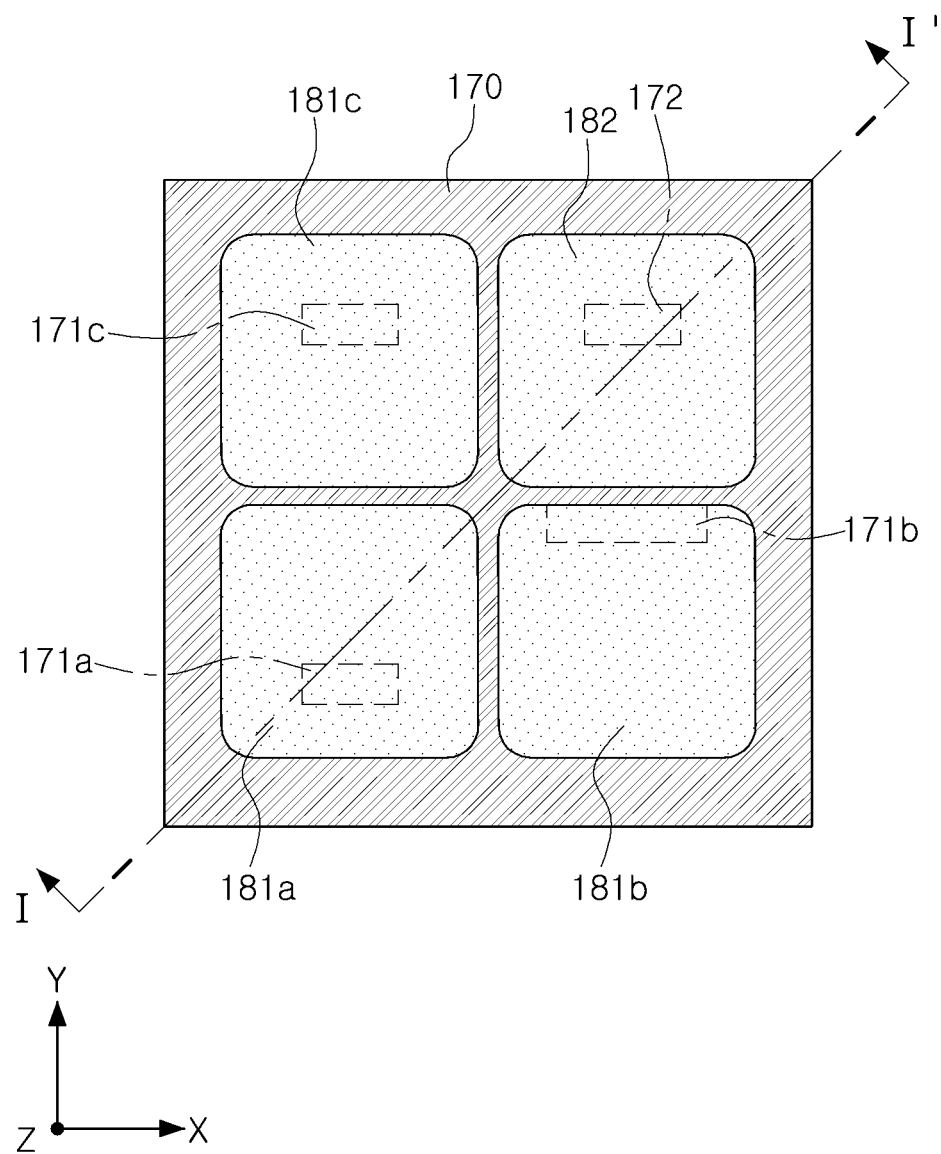
Figure 12B:
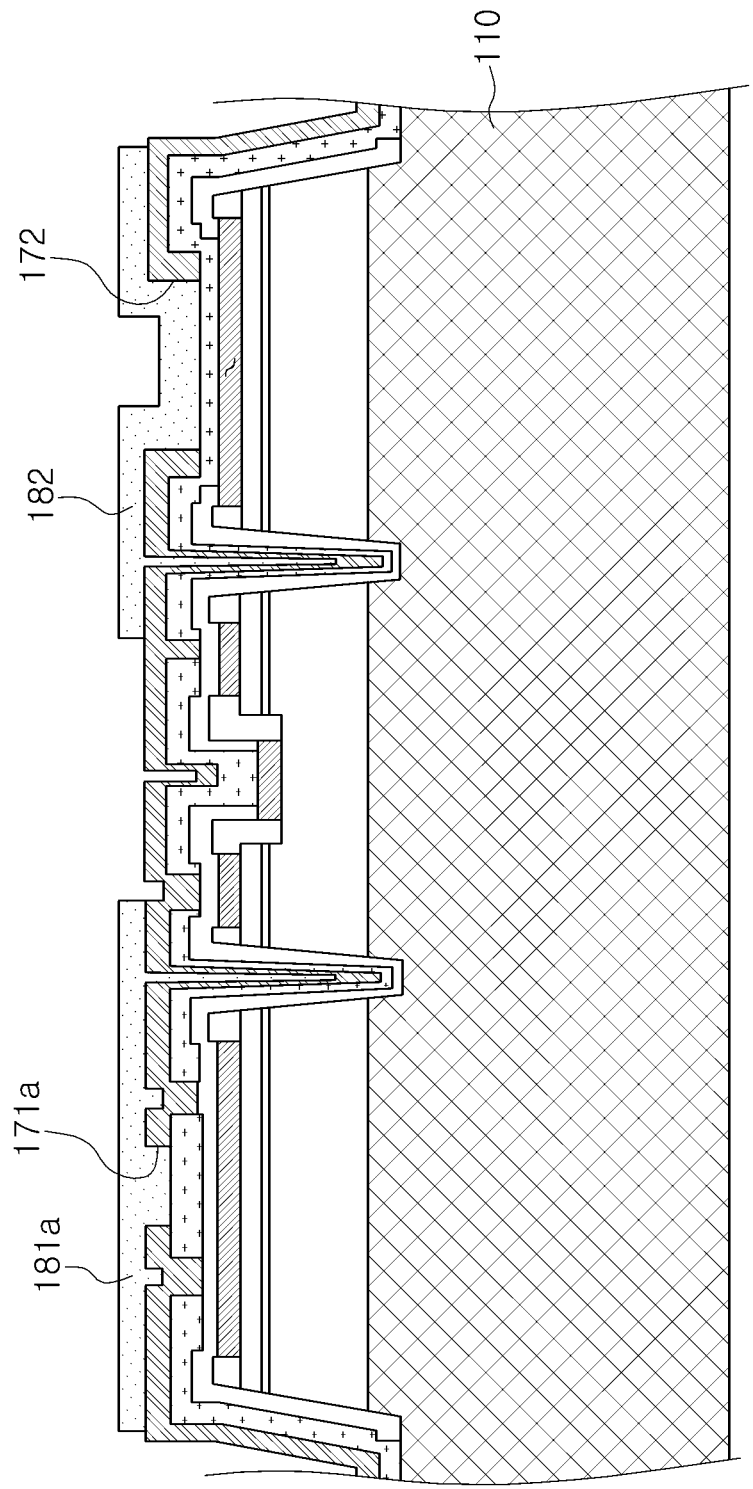

With reference to FIGS. 12A and 12B, the first pad parts 181a, 181b, and 181c as well as the second pad part 182 connected to the first openings 171a, 171b, and 171c as well as the second opening 172 of the interlayer insulating layer 170, respectively, may be deposited.

Figure 13A:
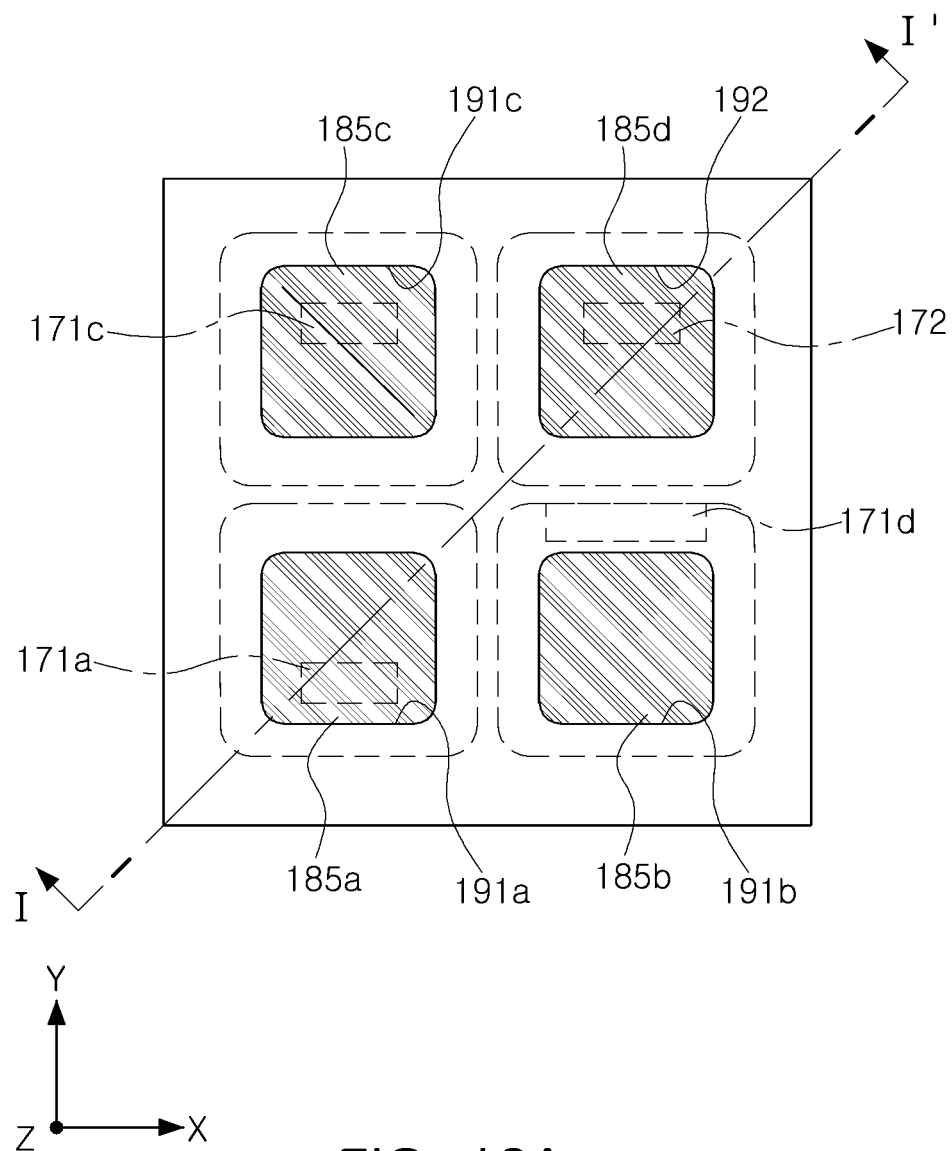
Figure 13B:
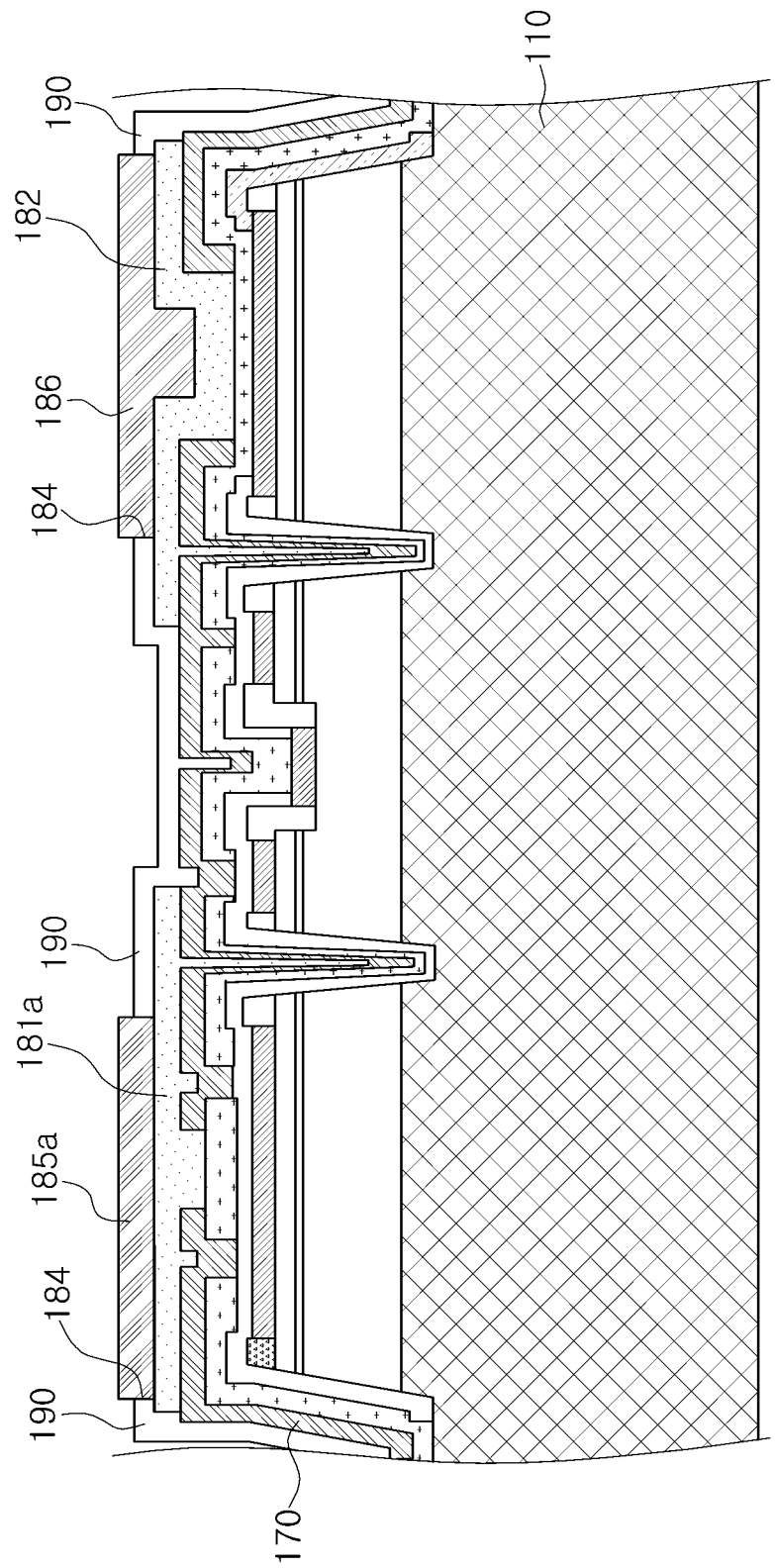

With reference to FIGS. 13A and 13B, the passivation layer 190 covering the interlayer insulating layer 170, the first pad parts 181a, 181b, and 181c as well as the second pad part 182, and having the first openings 191a, 191b, and 191c as well as the second opening 192 defining a region in which an under bump metallurgy (UBM) layer is deposited, and UBM layers 185a, 185b, 185c, and 185d may be deposited inside the first openings 191a, 191b, and 191c as well as the second opening 192.

Figure 14A:
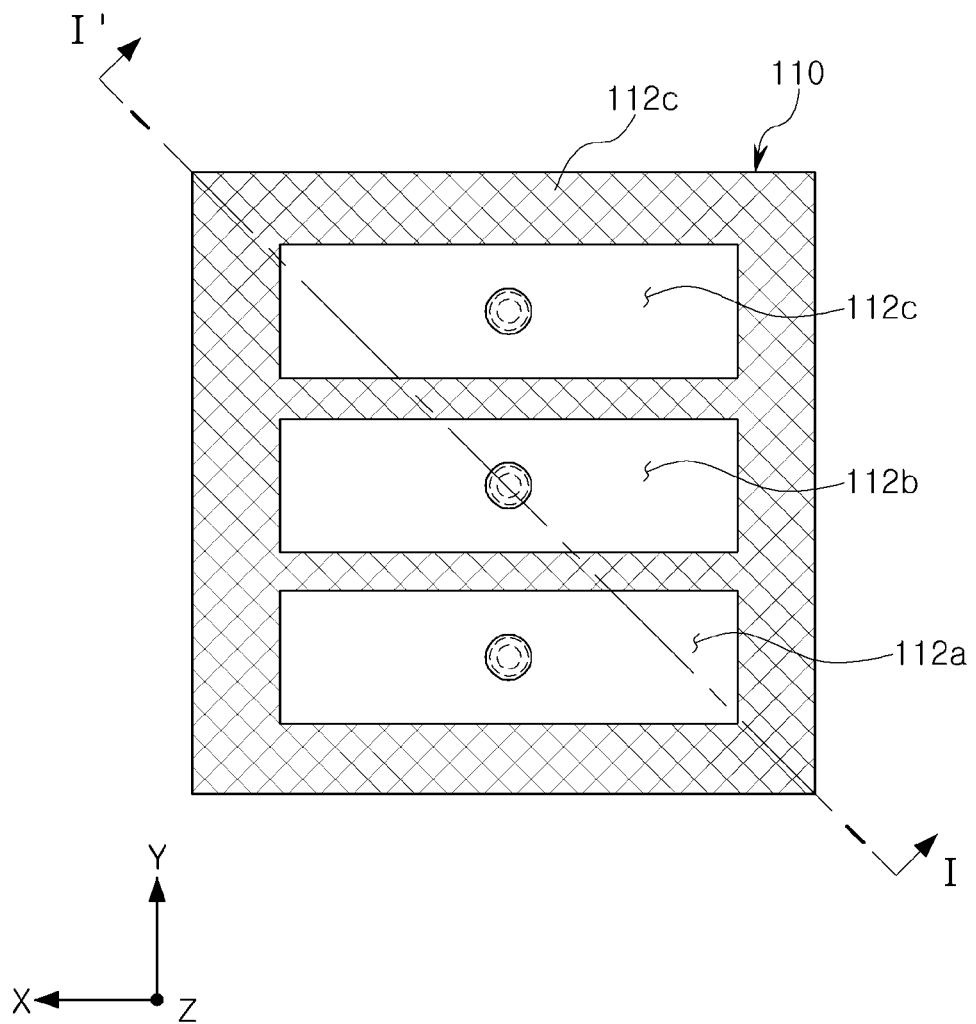
Figure 14B:
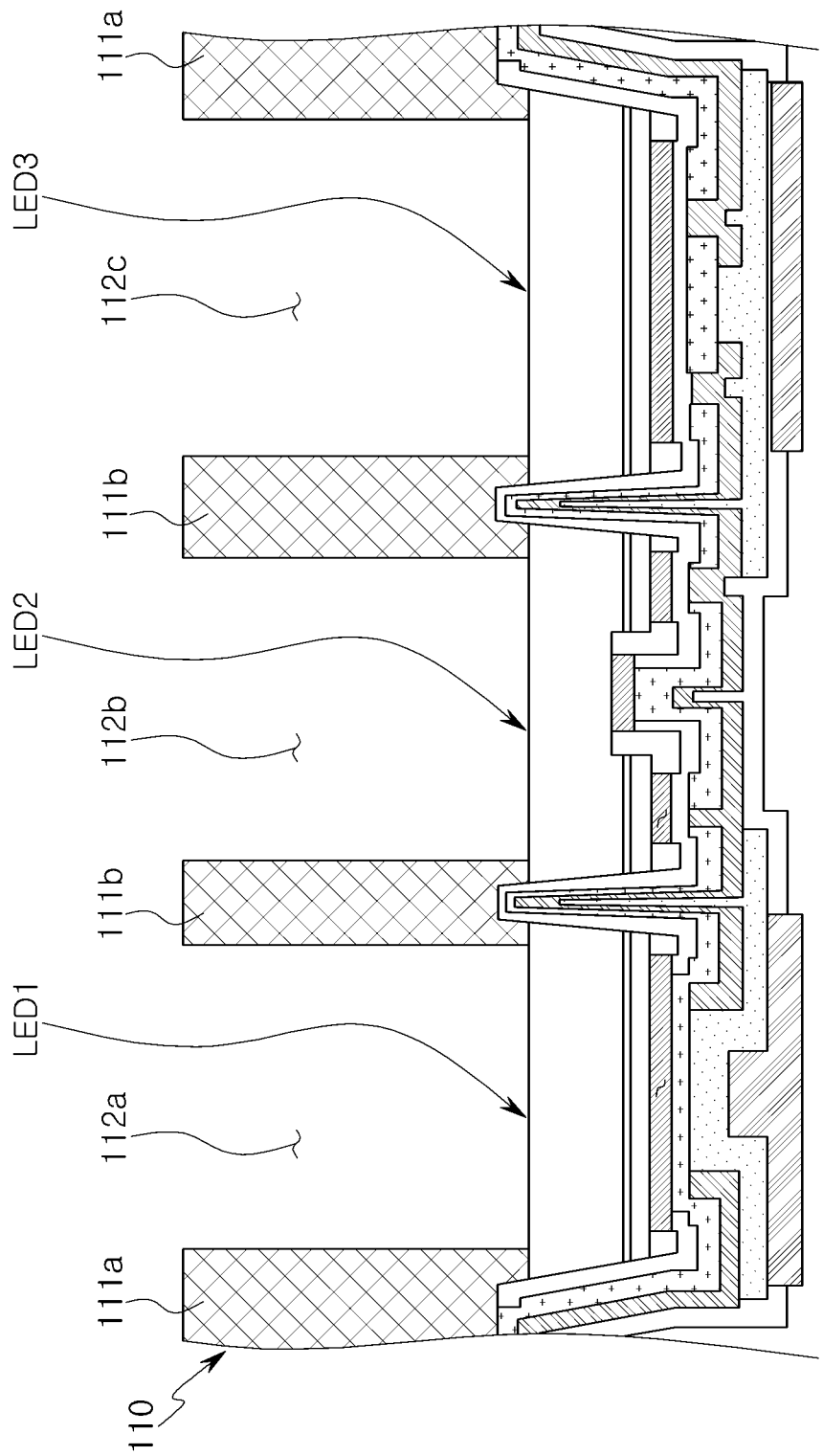

With reference to FIGS. 14A and 14B, a region of the substrate for growth 110 corresponding to each of the first semiconductor light-emitting unit LED1, the second semiconductor light-emitting unit LED2, and the third semiconductor light-emitting unit LED3 is etched to form to each of the first light-emitting window 112a, the second light-emitting window 112b, and the third light-emitting window 112c A light-transmitting liquid resin mixed with a wavelength conversion material is individually dispensed into the first light-emitting window 112a, the second light-emitting window 112b, and the third light-emitting window 112c to form the first wavelength conversion unit 113, the second wavelength conversion unit 114, and the third wavelength conversion unit 115 to be cut into discrete semiconductor light-emitting device units using a cutting blade. Thus, the light emitting device package 100 illustrated in FIGS. 3 and 4 may be manufactured.

As set forth above, according to example embodiments of the present inventive concept, an insulating layer in which a light-leakage phenomenon may occur is covered with a metal support layer, thereby providing a light emitting device package in which a light-leakage phenomenon does not occur and a display device using the same.

While example embodiments have been shown and described above, it will be apparent to those skilled in the art that modifications and variations could be made without departing from the scope of the present disclosure as defined by the appended claims.

What is claimed is:
1. A light emitting device package, comprising:
a substrate for growth having a plurality of light-emitting windows;

a plurality of semiconductor light-emitting units corresponding to the plurality of light-emitting windows, each semiconductor light-emitting unit having a first surface contacting the substrate for growth and a second surface opposite the first surface, and each semiconductor light-emitting unit having a first conductivity-type semiconductor layer, an active layer, and a second conductivity-type semiconductor layer stacked on each other;

a plurality of wavelength conversion units respectively disposed inside the plurality of light-emitting windows, each wavelength conversion unit is configured to provide light having a wavelength different from light emitted by the respective semiconductor light-emitting unit;

a metal support layer disposed on at least one surface of each the plurality of semiconductor light-emitting units and having a lateral surface coplanar with a lateral surface of the substrate for growth; and an insulating layer disposed between each of the plurality of semiconductor light-emitting units and a respective metal support layer.

2. The light emitting device package of claim 1, wherein the plurality of light-emitting windows are defined by a partition structure.

3. The light emitting device package of claim 1, wherein each of the plurality of the semiconductor light-emitting units includes a first electrode and a second electrode electrically connected to the corresponding first conductivity-type semiconductor layer and the corresponding second conductivity-type semiconductor layer, respectively, and the metal support layer includes: a plurality of first regions respectively connected to the first electrodes of the plurality of semiconductor light-emitting units; and a second region disposed to be spaced apart from the first regions and commonly connected to the second electrodes of the plurality of semiconductor light-emitting units.

4. The light emitting device package of claim 1, wherein each of the plurality of the semiconductor light-emitting units includes a first electrode and a second electrode electrically connected to the corresponding first conductivity-type semiconductor layer and the corresponding second conductivity-type semiconductor layer, respectively, and the metal support layer includes: a plurality of first regions respectively connected to the first electrodes of the plurality of semiconductor light-emitting units; and a second region surrounding the first regions and commonly connected to the second electrodes of the plurality of semiconductor light-emitting units.

5. The light emitting device package of claim 3, wherein the second region covers a region including an edge of the insulating layer.

6. The light emitting device package of claim 3, wherein the insulating layer includes a plurality of first openings and a second opening disposed on the first electrodes and the second electrodes, respectively, and the first electrodes and the second electrodes are connected to the plurality of first regions and the second region of the metal support layer through the plurality of first openings and the second opening, respectively.

7. The light emitting device package of claim 1, wherein the metal support layer is formed of a material including at least one of copper (Cu), gold (Au), and aluminum (Al).

8. The light emitting device package of claim 1, wherein the metal support layer has a thickness of at least 100 nm or more.

9. The light emitting device package of claim 1, wherein the insulating layer is spaced apart from a lateral surface of the substrate for growth by a distance greater than a thickness of the metal support layer.

10. The light emitting device package of claim 2, wherein in a region of one surface of the partition structure in contact with the first surface except for a region in contact with the plurality of semiconductor light-emitting units, a trench for isolating the plurality of semiconductor light-emitting units into discrete device units is formed.

11. The light emitting device package of claim 10, wherein on a side wall of the trench, the insulating layer and the metal support layer are individually stacked to be extended in a vertical direction.

12. The light emitting device package of claim 10, wherein a depth of the trench is greater than a thickness of the insulating layer.

13. The light emitting device package of claim 1, wherein the insulating layer is embedded between the substrate for growth and the metal support layer on the first surface.

14. The light emitting device package of claim 1, wherein an upper surface of the insulating layer is coplanar with an upper surface of the metal support layer on the first surface.

15. A light emitting device package, comprising:

a cell array, including a plurality of semiconductor light-emitting units, each semiconductor light-emitting unit having a first surface at a first vertical height and a second surface opposite the first surface at a second vertical height, and each semiconductor light emitting unit including a first conductivity-type semiconductor layer, an active layer, and a second conductivity-type semiconductor layer stacked on each other;

a plurality of wavelength conversion units disposed respectively on the plurality of semiconductor light-emitting units, each wavelength conversion unit having a first surface at the first vertical height and a second surface at a third vertical height, wherein the first vertical height is between the second vertical height and the third vertical height, each wavelength conversion unit configured to convert a wavelength of light, emitted by a respective one of the plurality of semiconductor light emitting units, into a different wavelength of light;

a metal support layer disposed on at least one surface of each of the plurality of semiconductor light-emitting units and having a lateral surface coplanar with a lateral surface of the substrate for growth; and an insulating layer disposed between each of the plurality of semiconductor light-emitting units and a respective metal support layer.

16. The light emitting device package of claim 15, further comprising a partition structure disposed in a space between the plurality of wavelength conversion units so as to separate the plurality of wavelength conversion units from each other, the partition structure extending between the first vertical height and the third vertical height.

17. The light emitting device package of claim 15, wherein each of the plurality of the semiconductor light-emitting units includes a first electrode and a second electrode electrically connected to the corresponding first conductivity-type semiconductor layer and the corresponding second conductivity-type semiconductor layer, respectively, and the metal support layer includes: a plurality of first regions respectively connected to the first electrodes of the plurality of semiconductor light-emitting units; and a second region disposed to be spaced apart from the first regions and commonly connected to the second electrodes of the plurality of semiconductor light-emitting units.

18. The light emitting device package of claim 15, wherein each of the plurality of the semiconductor light-emitting units includes a first electrode and a second electrode electrically connected to the corresponding first conductivity-type semiconductor layer and the corresponding second conductivity-type semiconductor layer, respectively, and the metal support layer includes: a plurality of first regions respectively connected to the first electrodes of the plurality of semiconductor light-emitting units; and
a second region surrounding the first regions and commonly connected to the second electrodes of the plurality of semiconductor light-emitting units.

19. The light emitting device package of claim 17, wherein the second region covers a region including an edge of the insulating layer.

20. A display device, comprising:
a display panel including a circuit board and a plurality of light emitting device packages disposed on the circuit board in rows and columns, each of the plurality of light emitting device packages providing a single pixel;
a panel driving unit configured to drive the display panel; and
a control unit configured to control the panel driving unit, wherein each of the plurality of light emitting device packages includes:
a substrate for growth having a plurality of light-emitting windows;
a plurality of semiconductor light-emitting units corresponding to the plurality of light-emitting windows, each semiconductor light-emitting unit including a first conductivity-type semiconductor layer, an active layer, and a second conductivity-type semiconductor layer;
a plurality of wavelength conversion units correspondingly disposed inside the plurality of light-emitting windows, each wavelength conversion unit configured to convert a wavelength of light, emitted by a respective one of the plurality of semiconductor light emitting units, into a different wavelength of light;
a metal support layer disposed on at least one surface of each of the plurality of semiconductor light-emitting units and having a lateral surface coplanar with a lateral surface of the substrate for growth; and
an insulating layer disposed between each of the plurality of semiconductor light-emitting units and a respective metal support layer.

* * * * *